(12) United States Patent
Zang et al.

(10) Patent No.: US 10,438,955 B2
(45) Date of Patent: Oct. 8, 2019

(54) DEVICES WITH CONTACT-TO-GATE SHORTING THROUGH CONDUCTIVE PATHS BETWEEN FINS AND FABRICATION METHODS

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/995,896

(22) Filed: Jun. 1, 2018

(65) Prior Publication Data

US 2018/0286873 A1 Oct. 4, 2018

Related U.S. Application Data

(62) Division of application No. 15/248,889, filed on Aug. 26, 2016, now Pat. No. 10,014,303.

(51) Int. Cl.
| | |
|---|---|
| *H01L 21/768* | (2006.01) |
| *H01L 27/11* | (2006.01) |
| *H01L 29/66* | (2006.01) |
| *H01L 21/311* | (2006.01) |

(Continued)

(52) U.S. Cl.
CPC ..... *H01L 27/1104* (2013.01); *H01L 21/31111* (2013.01); *H01L 21/31144* (2013.01); *H01L 21/76895* (2013.01); *H01L 21/76897* (2013.01); *H01L 23/535* (2013.01); *H01L 29/66545* (2013.01); *H01L 29/66795* (2013.01); *H01L 29/785* (2013.01); *H01L 27/11* (2013.01)

(58) Field of Classification Search
CPC ........... H01L 27/1104; H01L 21/31111; H01L 23/31144; H01L 21/76895; H01L 23/535; H01L 29/66545; H01L 29/66795; H01L 29/785

See application file for complete search history.

(56) References Cited

U.S. PATENT DOCUMENTS

2007/0287255 A1* 12/2007 Doyle ............... H01L 29/66795
438/279
2008/0277739 A1* 11/2008 Curatola ........... H01L 21/82341
257/393

(Continued)

*Primary Examiner* — Matthew C Landau
*Assistant Examiner* — Dmitriy Yemelyanov
(74) *Attorney, Agent, or Firm* — Thompson Hine LLP; Francois Pagette

(57) ABSTRACT

Semiconductor devices and methods of fabricating the semiconductor devices for forming conductive paths between fins for contact-to-gate shorting. One method includes, for instance: obtaining wafer with a substrate, at least one fin, at least one hard mask, and an oxide layer; etching the oxide layer to reveal at least one of a portion of the hard masks; forming sacrificial pillars over the substrate; forming sacrificial gates, wherein at least one sacrificial gate contacts at least one sacrificial pillar; growing an epitaxial layer between the at least one sacrificial gate and the at least one sacrificial pillar; starting a RMG process on the sacrificial gates; etching to remove the sacrificial pillars and form pillar openings; and completing the RMG process to fill the pillar openings and the gate openings with a metal.

8 Claims, 23 Drawing Sheets

(51) Int. Cl.
*H01L 29/78* (2006.01)
*H01L 23/535* (2006.01)

(56) References Cited

U.S. PATENT DOCUMENTS

| | | | |
|---|---|---|---|
| 2008/0318375 A1* | 12/2008 | Van Noort | H01L 29/66795 438/212 |
| 2009/0166743 A1 | 7/2009 | Pillarisetty | |
| 2013/0099295 A1 | 4/2013 | Baars | |
| 2014/0008720 A1 | 1/2014 | Xie | |
| 2014/0134836 A1 | 5/2014 | Pranatharthiharan | |
| 2014/0291737 A1 | 10/2014 | Hafez | |
| 2015/0115371 A1 | 4/2015 | Ganz et al. | |
| 2015/0263172 A1 | 9/2015 | Cho et al. | |
| 2016/0240651 A1* | 8/2016 | Lee | H01L 29/785 |

* cited by examiner

US 10,438,955 B2

DEVICES WITH CONTACT-TO-GATE SHORTING THROUGH CONDUCTIVE PATHS BETWEEN FINS AND FABRICATION METHODS

CROSS-REFERENCE TO RELATED APPLICATION

This application is a divisional of U.S. application Ser. No. 15/248,889 filed Aug. 26, 2016, which is hereby incorporated herein by reference in its entirety.

FIELD OF THE INVENTION

The present invention relates to semiconductor devices, methods of fabricating semiconductor devices, and more particularly to circuit structures, such as static random access memory (SRAM) cells, and methods and devices for forming conductive paths between fins for contact-to-gate shorting.

BACKGROUND OF THE INVENTION

As semiconductor devices continue to decrease in size based on consumer demand, the semiconductor industry continues to pursue formation of devices with smaller cell layouts. With smaller cell layouts the components need to decrease in size and be placed closer together. As the cell layouts shrink, the currently used processes may no longer have the desired yield. Thus, new devices and methods for semiconductor devices with smaller SRAM cell layouts which maintain the desired yield are needed.

SUMMARY OF THE INVENTION

The shortcomings of the prior art are overcome and additional advantages are provided through the provision, in one aspect, a method includes, for instance: obtaining wafer with a substrate, at least one fin, at least one fin hard mask over the fin, and an oxide layer over the substrate; etching the oxide layer to reveal at least a portion of the fin hard masks; forming sacrificial pillars over the substrate; forming sacrificial gates, wherein at least one sacrificial gate contacts at least one sacrificial pillar; performing a first part of a replacement metal gate process on the sacrificial gates; etching to remove the sacrificial pillars and form pillar openings; and performing a second part of the replacement metal gate process to fill the pillar openings and the gate openings with a metal.

In another aspect, an intermediate semiconductor device is provided which includes, for instance: a substrate; at least two fins formed on the substrate; at least one pillar positioned between the fins; and at least one gate with a gate metal, wherein the gate metal directly contacts the at least one pillar.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with a smaller SRAM cell layout by eliminating the CA/CB shorting constructs and enhanced yield with fewer contacts.

Figure 1:
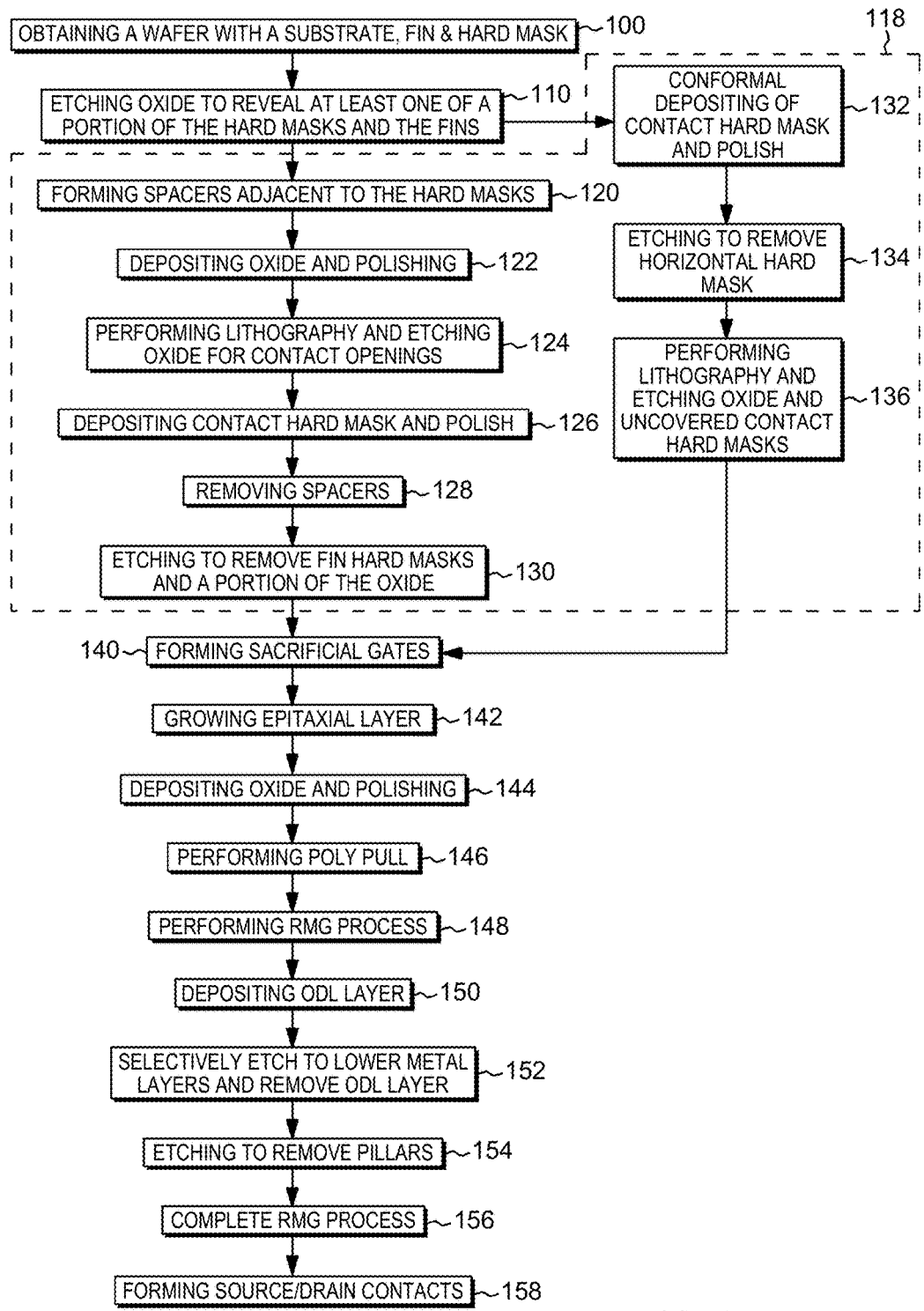
FIG. 1 depicts an embodiment of a method for forming conductive paths between fins for contact-to-gate shorting, in accordance with one or more aspects of the present invention.

In one aspect, as shown in FIG. 1, a method for forming conductive paths between fins for contact-to-gate shorting used during semiconductor processing is shown. The formation process, in accordance with one or more aspects of the present invention, may include, for instance: obtaining a wafer with at least one fin, at least one hard mask and an oxide layer 100; etching the oxide layer to reveal at least one of a portion of the hard masks and the fins 110; forming sacrificial pillars 118; forming sacrificial gates 140; growing an epitaxial layer 142; depositing oxide and polishing 144; performing a poly pull 146; performing a first part of the RMG process 148; depositing ODL layer 150; selectively etching to lower the high-K and work function metal layers and remove ODL layer 152; etching to remove the sacrificial pillars 154; completing RMG process 156; and forming source/drain contacts 158.

In one aspect, in one embodiment as shown in FIG. 1, the forming sacrificial pillars 118 may include, for instance: forming spacers adjacent to the hard masks 120; depositing oxide and polishing 122; performing lithography and etching the oxide to form contact openings 124; depositing a contact hard mask and polishing 126; removing the spacers 128; and etching to remove the fin hard masks and a portion of the oxide 130.

In another aspect, in one embodiment as shown in FIG. 1, the forming sacrificial pillars 118 may include, for instance: conformal deposition of contact hard mask and polishing 132; etching to remove the horizontal portion of the hard mask 134; and performing lithography and etching the oxide and uncovered contact hard masks 136.

FIGS. 2-29 depict, by way of example only, a detailed embodiment of a portion of a semiconductor device formation process of FIG. 1 and a wafer 200, in accordance with one or more aspects of the present invention. Note again that these figures are not drawn to scale in order to facilitate understanding of the invention, and that the same reference numerals used throughout different figures designate the same or similar elements.

Figure 2:
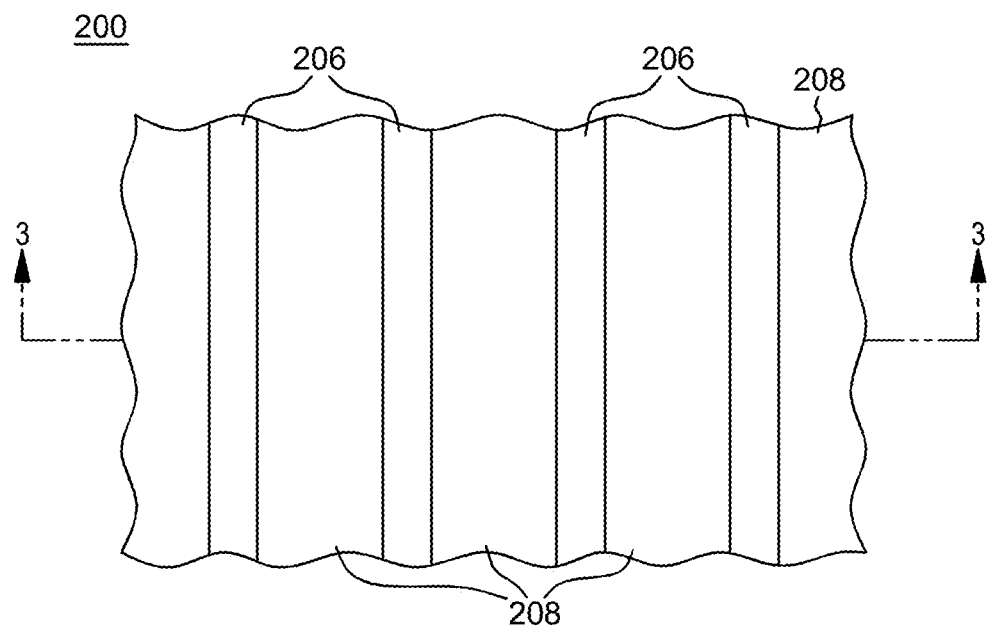
FIG. 2 depicts a top view of one embodiment of a wafer with a fin, hard mask and oxide formed on the wafer to form an intermediate semiconductor device, in accordance with one or more aspects of the present invention.
Figure 3:
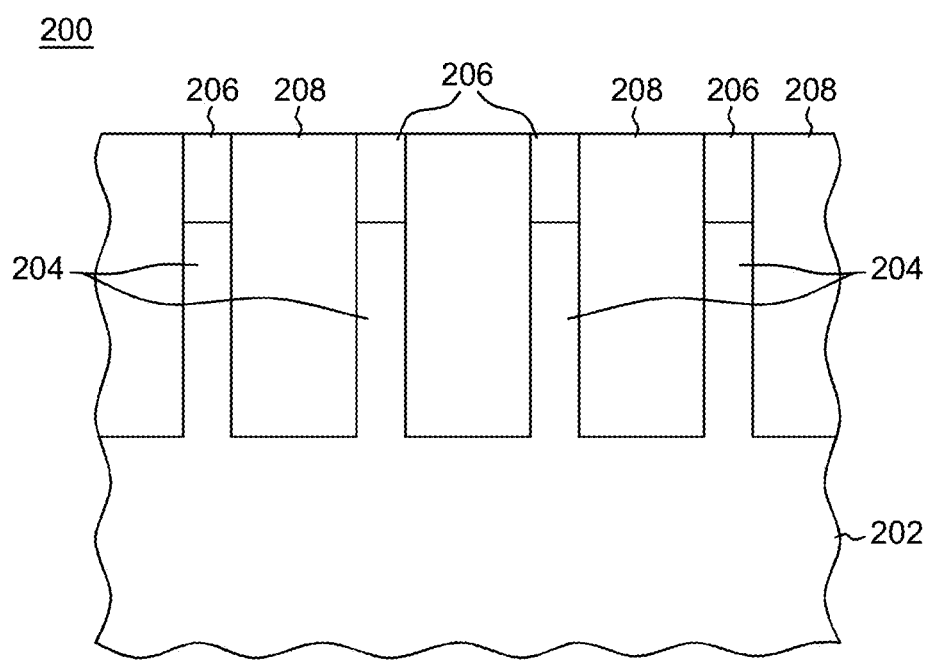
FIG. 3 depicts a cross-sectional elevation view of the intermediate semiconductor device of FIG. 2 taken along line 3-3, in accordance with one or more aspects of the present invention.

One detailed embodiment of a portion of the semiconductor device formation process of FIG. 1 is depicted, by way of example only, in FIGS. 2-29. FIGS. 2 and 3 show a portion of a semiconductor wafer 200 obtained during the fabrication process. The wafer 200 may include, for example, a substrate 202. The substrate 202 may in some embodiments have or be a substantially crystalline substrate material (i.e., bulk silicon), whereas in other embodiments, the substrate 202 may be formed on the basis of a silicon-on-insulator (SOI) architecture or any known substrate, such as, glass, gallium nitride (GaN), gallium arsenide (AsGa), silicon carbide (SiC) or the like.

The wafer 200 may be processed through initial processing steps in accordance with the design of the wafer 200 being fabricated. For example, the device 200 may include at least one fin 204 formed on the substrate 202. The wafer 200 may also include a hard mask 206 positioned over the at least one fin 204. The hard mask 206 may be, for example, a silicon nitride (SiN), silicon oxynitride (SiON), titanium dioxide (TiO$_2$), aluminum nitride (AlN), titanium nitride (TiN), amorphous silicon (Si) layer or the like. An oxide layer 208 may be deposited over the wafer 200. The oxide layer 208 may be, for example, a silicon dioxide (SiO$_2$) layer.

Figure 4:
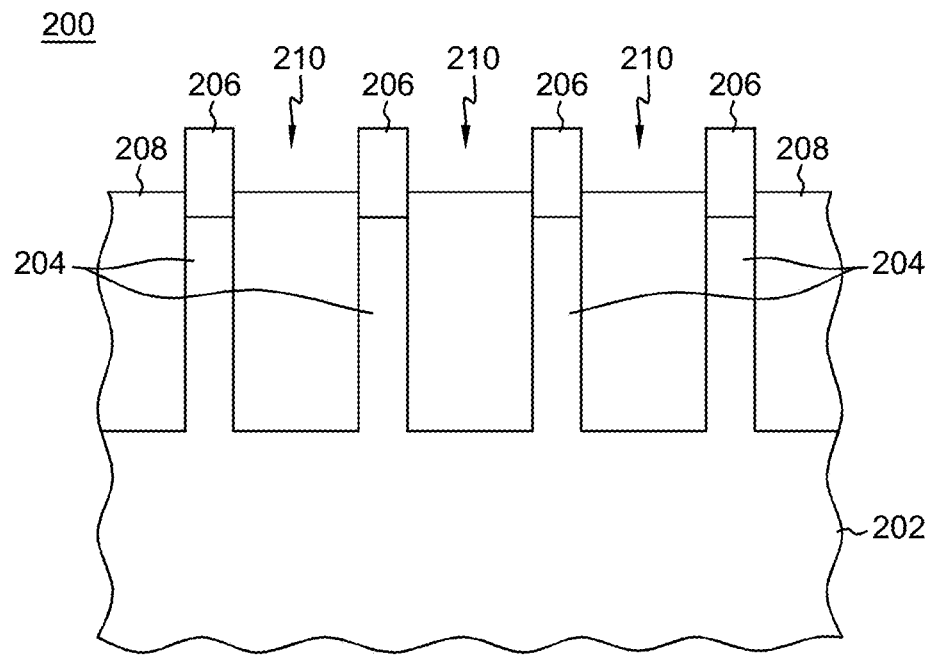
FIG. 4 depicts the cross-sectional elevation view of the intermediate semiconductor device of FIG. 3 after etching the oxide layer of the intermediate semiconductor device, in accordance with one or more aspects of the present invention.
Figure 5:
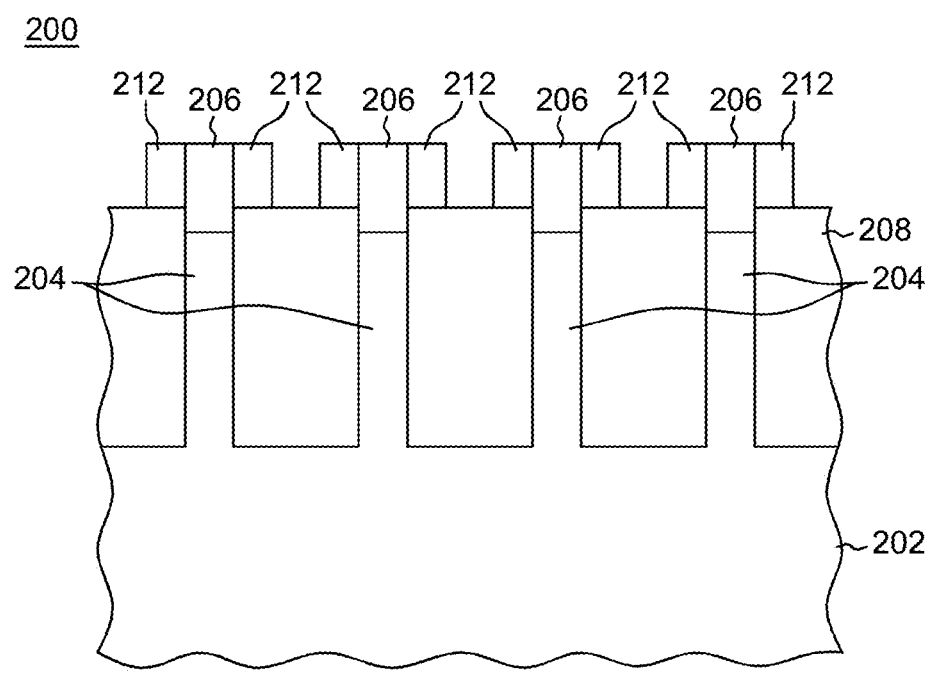
FIG. 5 depicts the cross-sectional elevation view of the intermediate semiconductor device of FIG. 4 after forming spacers adjacent to the hard mask, in accordance with one or more aspects of the present invention.
Figure 6:
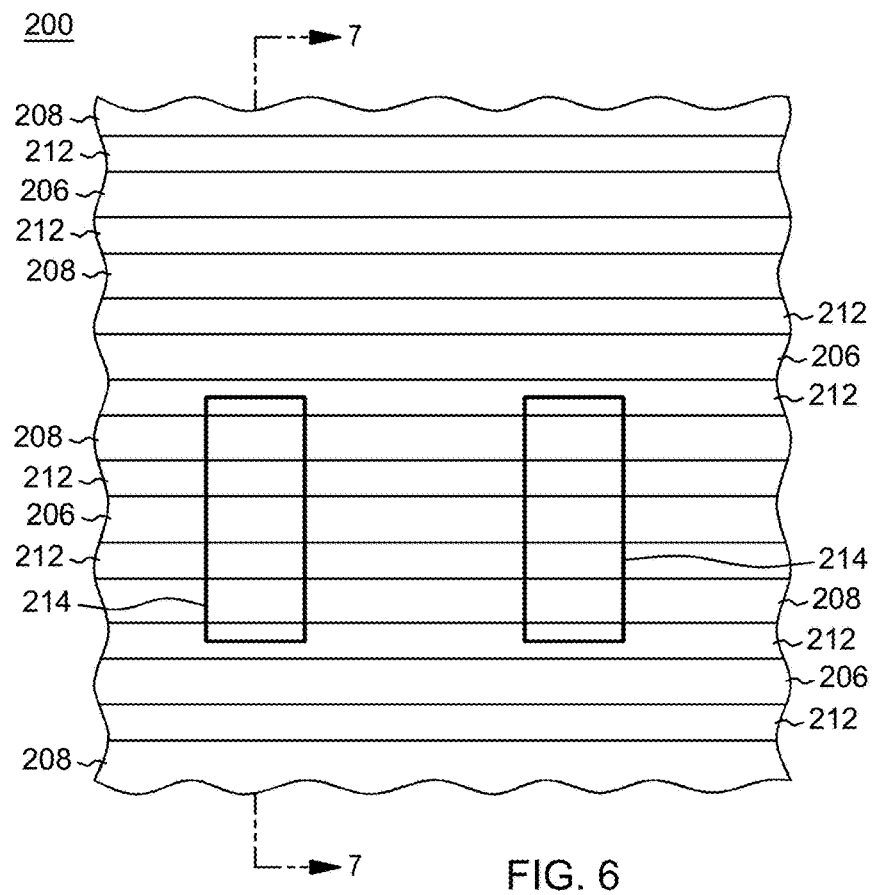
FIG. 6 depicts the top view of the intermediate semiconductor device of FIG. 5 after depositing and polishing another oxide layer, in accordance with one or more aspects of the present invention.

Next, as shown in FIG. 4, an etch may be performed to the oxide layer 208 to reveal a portion of the hard masks 206 and form recesses 210 in the oxide layer 208 between the hard masks 206. After the recesses 210 are formed, spacers 212 may be formed adjacent to the hard masks 206, as shown in FIG. 5. The spacers 212 may be formed by, for example, depositing a conformal layer of spacer material and then performing a vertical etch to remove the horizontal spacer material forming the sidewall spacers 212. The spacer material for spacers 212 may be, for example, a silicon nitride (SiN). The etch may be, for example, a reactive ion etch (RIE), such as, a controlled RIE. The RIE etch may be, for example, a nitride etch that is selective with respect to oxide when the spacer material is SiN. Then, another oxide layer 208 may be deposited over the wafer 200, as shown in FIGS. 6 and 7.

Figure 7:
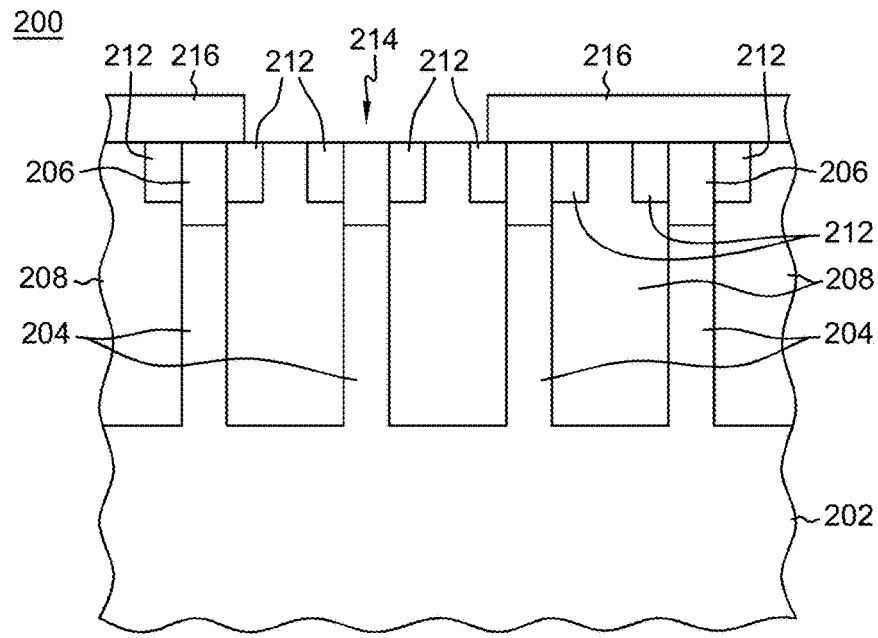
FIG. 7 depicts the cross-sectional elevation view of the intermediate semiconductor device of FIG. 6 taken along line 7-7 after depositing and patterning a photoresist layer, in accordance with one or more aspects of the present invention.
Figure 8:
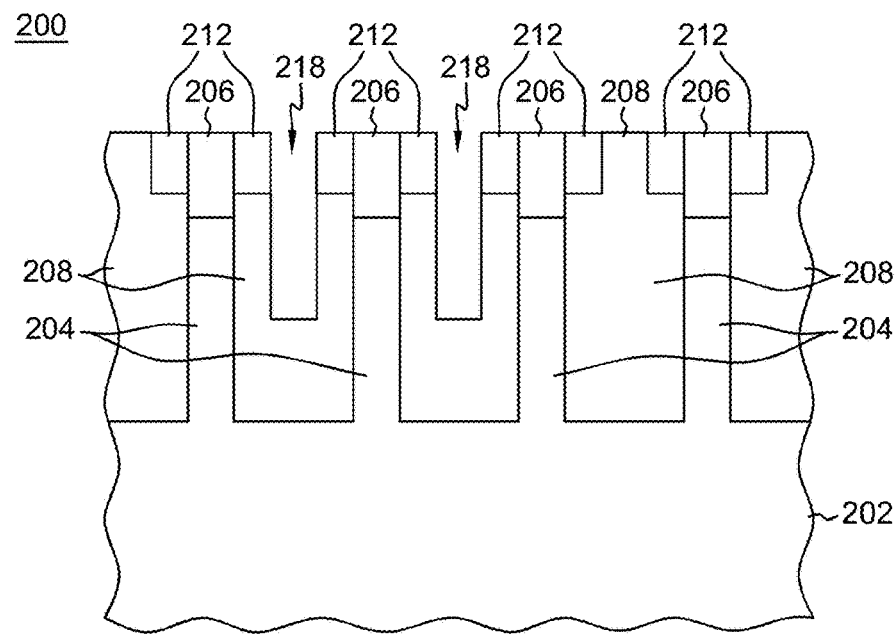
FIG. 8 depicts the cross-sectional elevation view of the intermediate semiconductor device of FIG. 7 after etching and removing the photoresist layer, in accordance with one or more aspects of the present invention.
Figure 9:
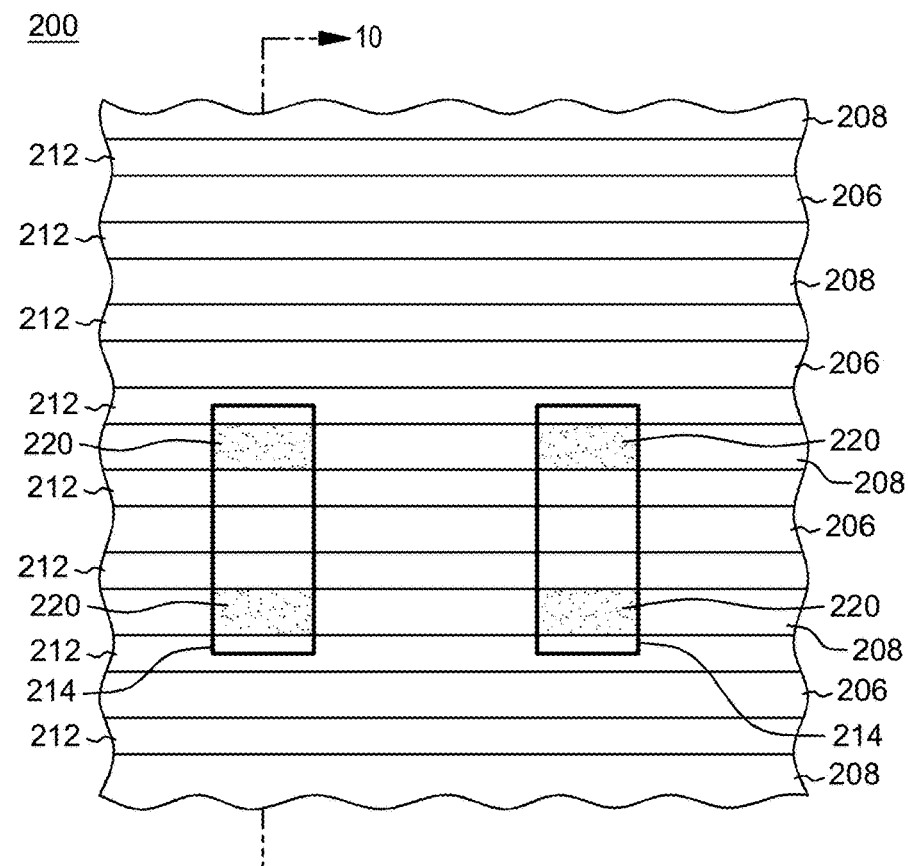
FIG. 9 depicts a top view of the intermediate semiconductor device of FIG. 8 after depositing a sacrificial pillar material, in accordance with one or more aspects of the present invention.
Figure 10:
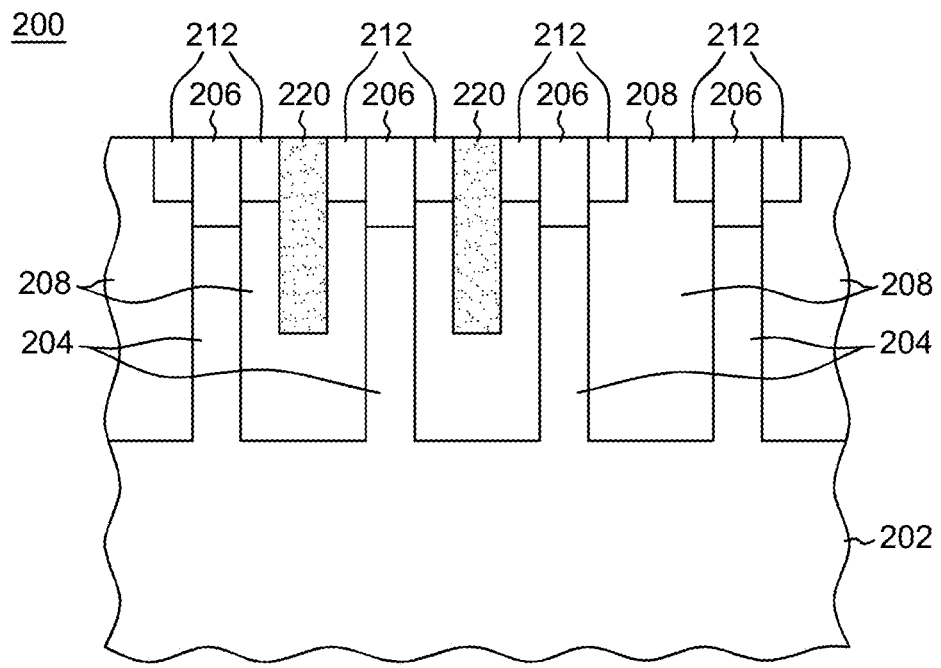
FIG. 10 depicts the cross-sectional elevation view of the intermediate semiconductor device of FIG. 9 taken along line 10-10, in accordance with one or more aspects of the present invention.
Figure 11:
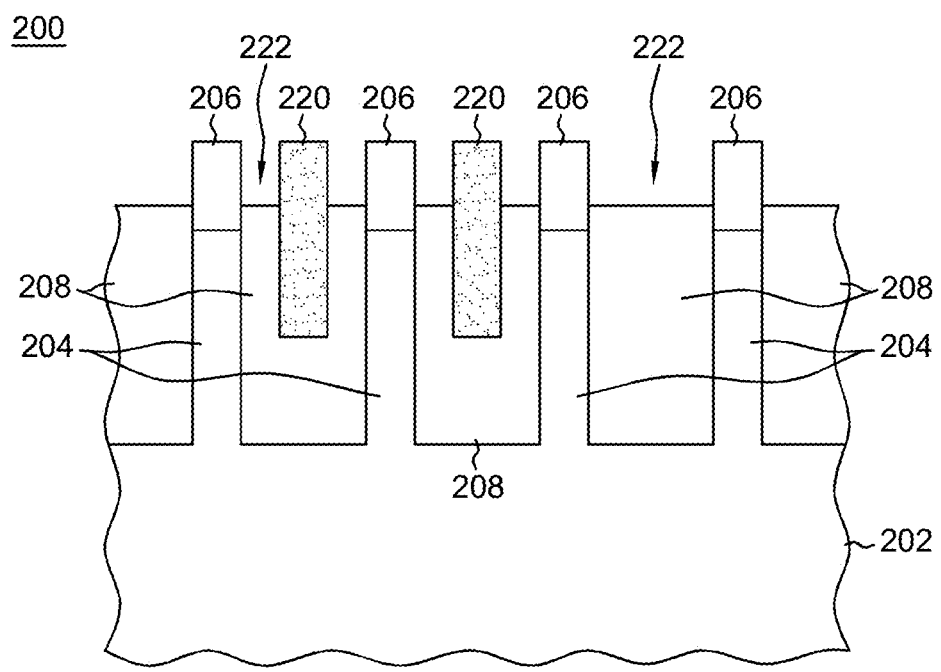
FIG. 11 depicts the cross-sectional elevation view of the intermediate semiconductor device of FIG. 10 after removing the spacers, in accordance with one or more aspects of the present invention.

After the oxide layer 208 is polished, lithography may then be performed using a mask 216 to pattern the conductive path openings into the device 200, as shown in FIG. 7. The lithography mask 216 may include at least one lithography mask opening 214 to pattern the conductive path openings, as shown in FIGS. 6 and 7. Next, an etch may be performed to remove a portion of the oxide layer 208 below the at least one lithography mask opening 214 to form at least one conductive path opening 218, as shown in FIG. 8. The etch may be, for example, an oxide reactive ion etch which is selective to nitride. Once the etching is complete a sacrificial pillar material is deposited into the openings 218. A planarization, for example, a chemical mechanical planarization (CMP) may then be performed to form contact hard masks or sacrificial pillars or regions 220, as shown in FIGS. 9 and 10. The sacrificial pillars 220 may be, for example, silicon nitride (SiN), an amorphous-carbon, or the like. After the sacrificial pillars 220 are formed, the spacers 212 may be removed, as shown in FIG. 11.

Figure 12:
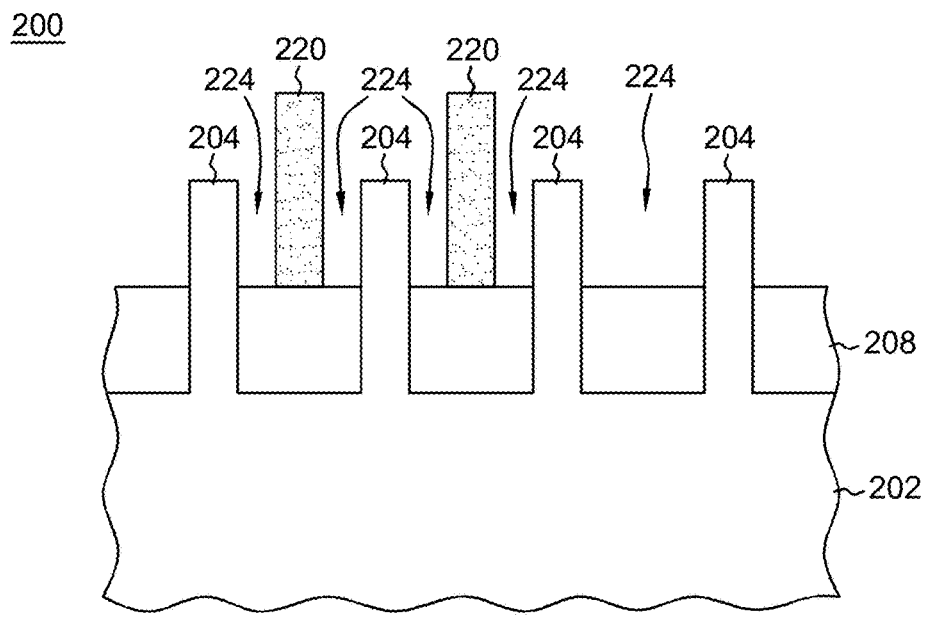
FIG. 12 depicts the cross-sectional elevation view of the intermediate semiconductor device of FIG. 11 after performing a fin hard mask and oxide etch, in accordance with one or more aspects of the present invention.
Figure 13:
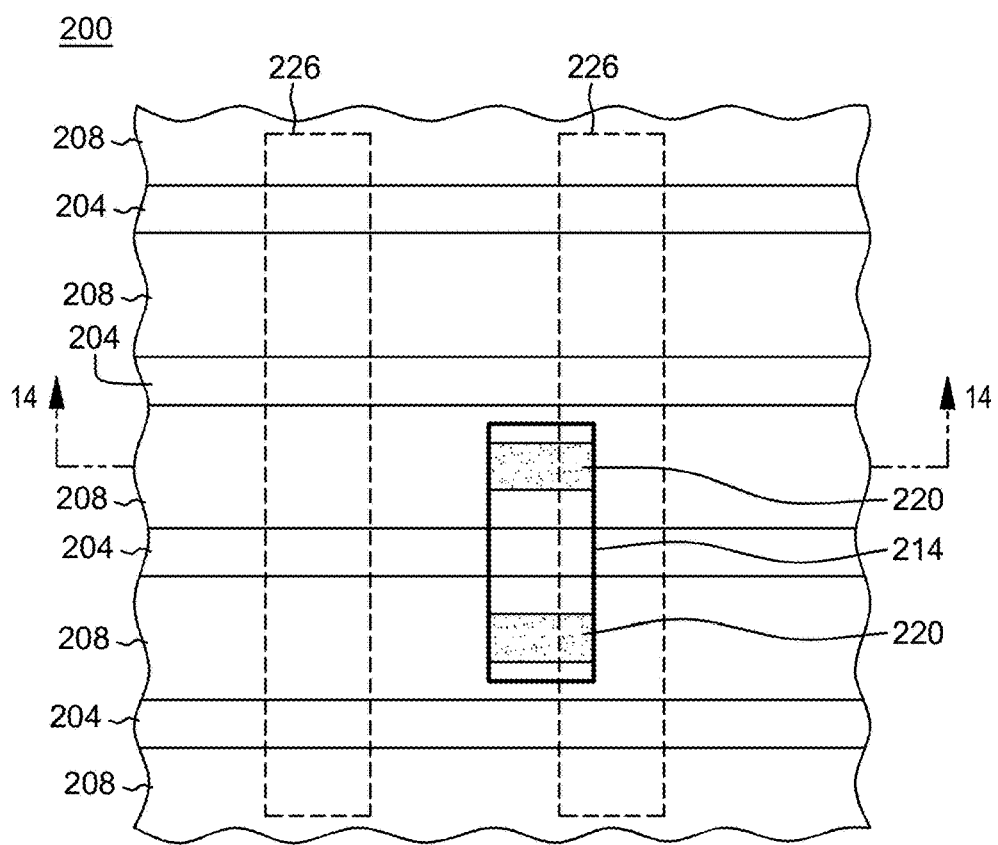
FIG. 13 depicts a top view of the intermediate semiconductor device of FIG. 12 after forming sacrificial gates on the device, in accordance with one or more aspects of the present invention.
Figure 14:
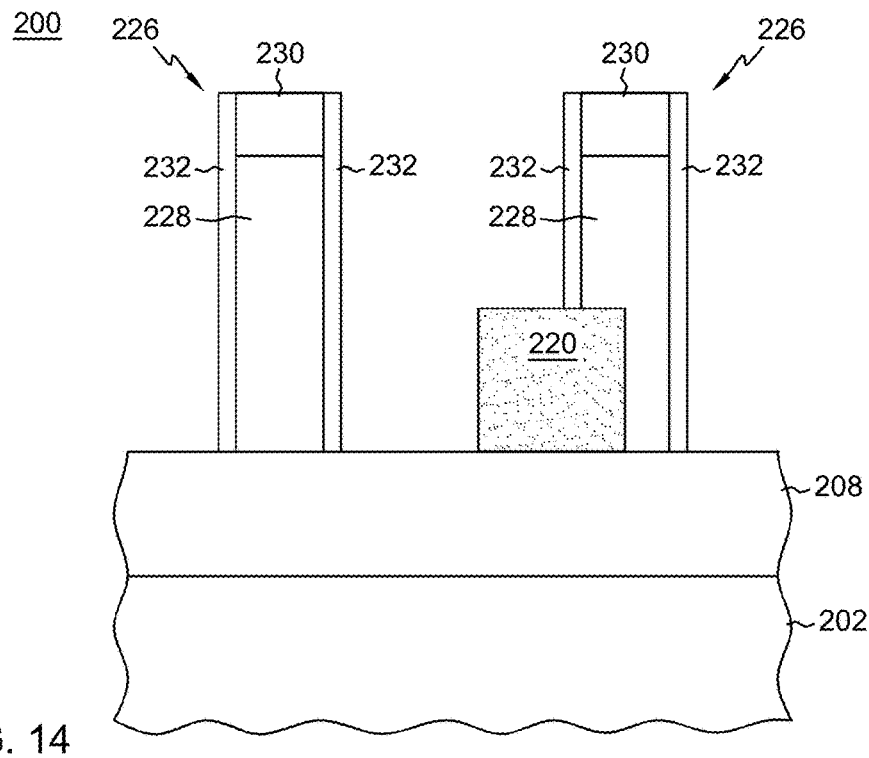
FIG. 14 depicts the cross-sectional elevation view of the intermediate semiconductor device of FIG. 13 taken along line 14-14, in accordance with one or more aspects of the present invention.

Referring now to FIG. 12, fin hard mask and oxide etching may be performed to form fin reveal openings 224. Next, sacrificial gates 226 may be formed, as shown in FIGS. 13 and 14. The sacrificial gates 226 may include a sacrificial gate material 228 with a gate hard mask 230 positioned over the sacrificial gate material 228 and the gate spacers 232 positioned adjacent to the sacrificial gate material 228 and the gate hard mask 230.

Figure 15:
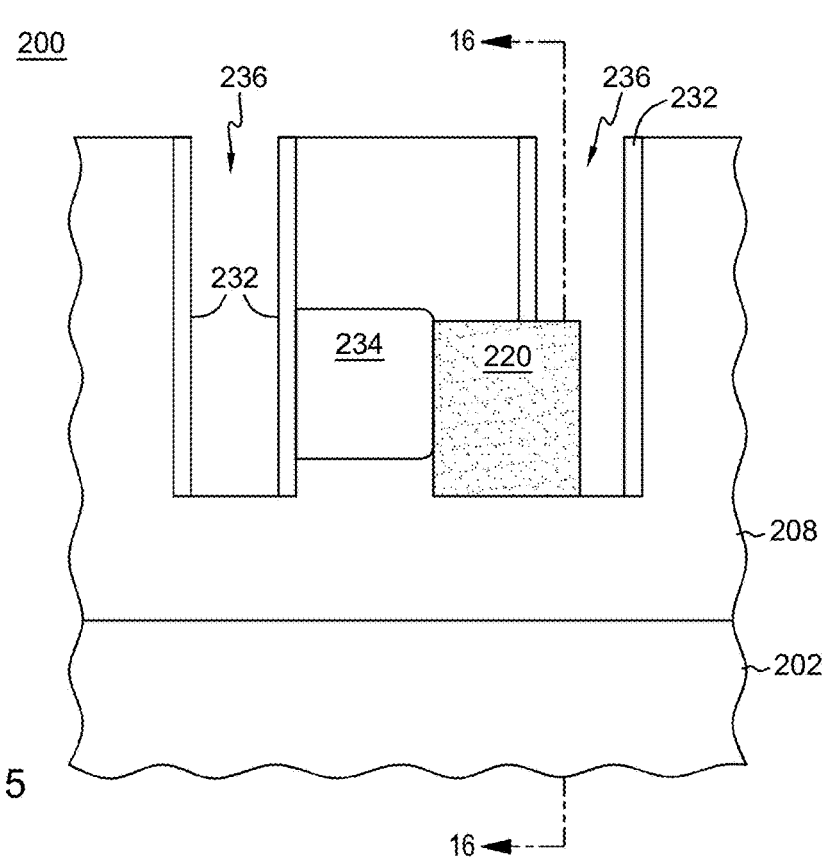
FIG. 15 depicts the cross-sectional elevation view of the intermediate semiconductor device of FIG. 14 after growing an epitaxial layer, depositing and polishing an oxide layer, and performing a poly pull to remove the hard mask and sacrificial gate material, in accordance with one or more aspects of the present invention.
Figure 16:
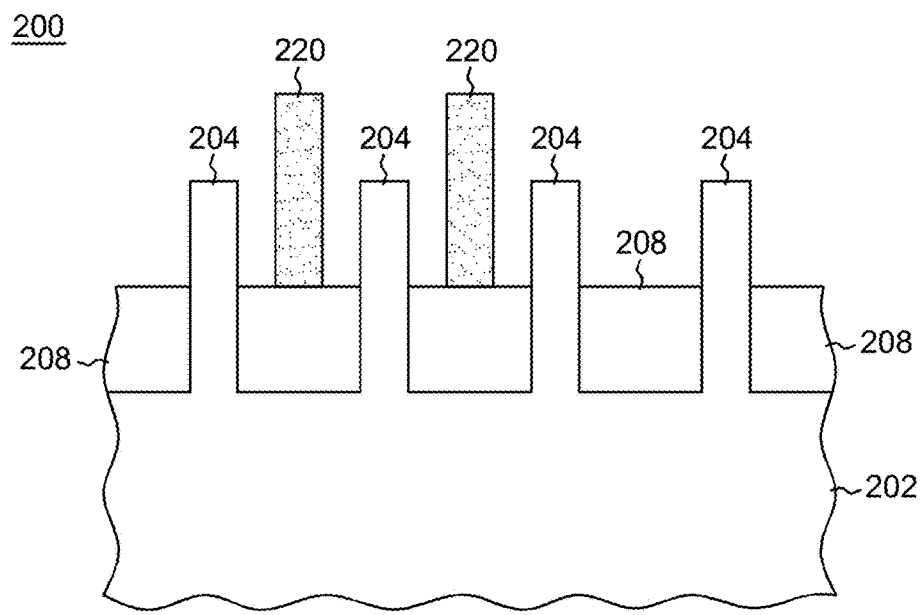
FIG. 16 depicts the cross-sectional view of the intermediate semiconductor device of FIG. 15 taken along line 16-16, in accordance with one or more aspects of the present invention.
Figure 17:
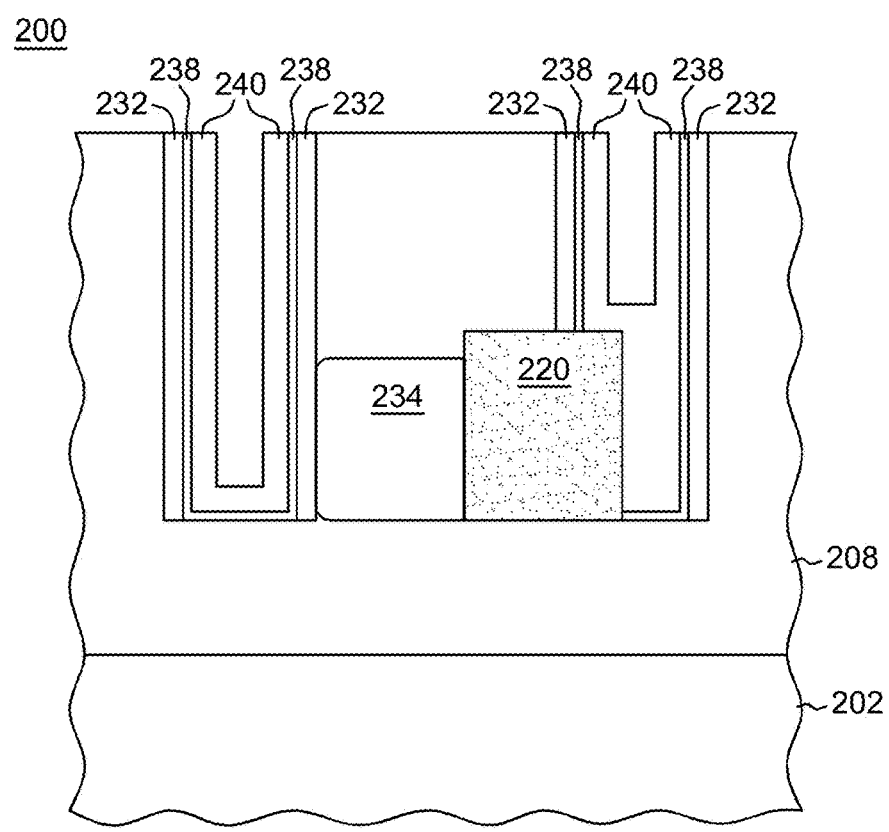
FIG. 17 depicts the cross-sectional elevation view of the intermediate semiconductor device of FIG. 15 after performing a first part of the replacement metal gate (RMG) process, in accordance with one or more aspects of the present invention.
Figure 18:
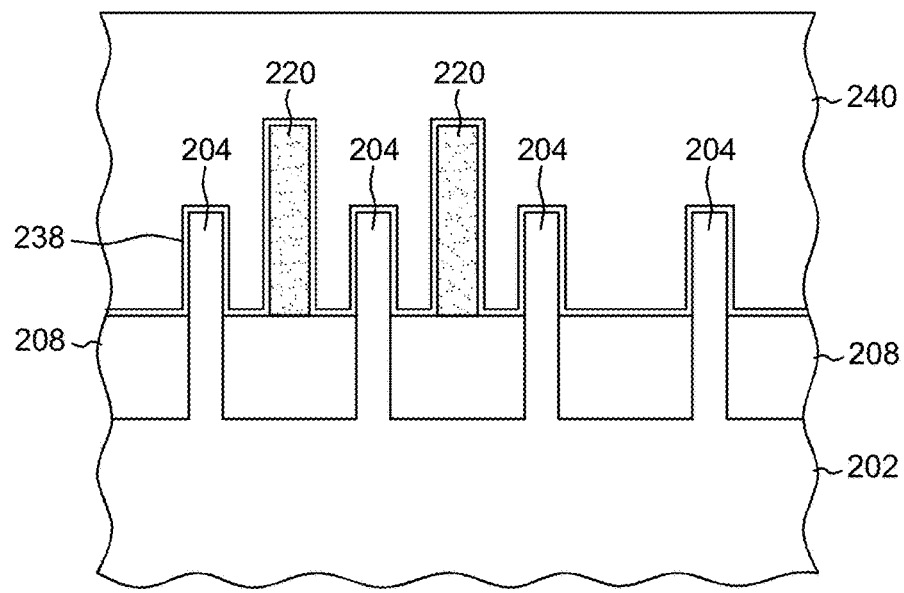
FIG. 18 depicts the cross-sectional elevation view of the intermediate semiconductor device of FIG. 16 after performing the first part of the RMG process, in accordance with one or more aspects of the present invention.
Figure 19:
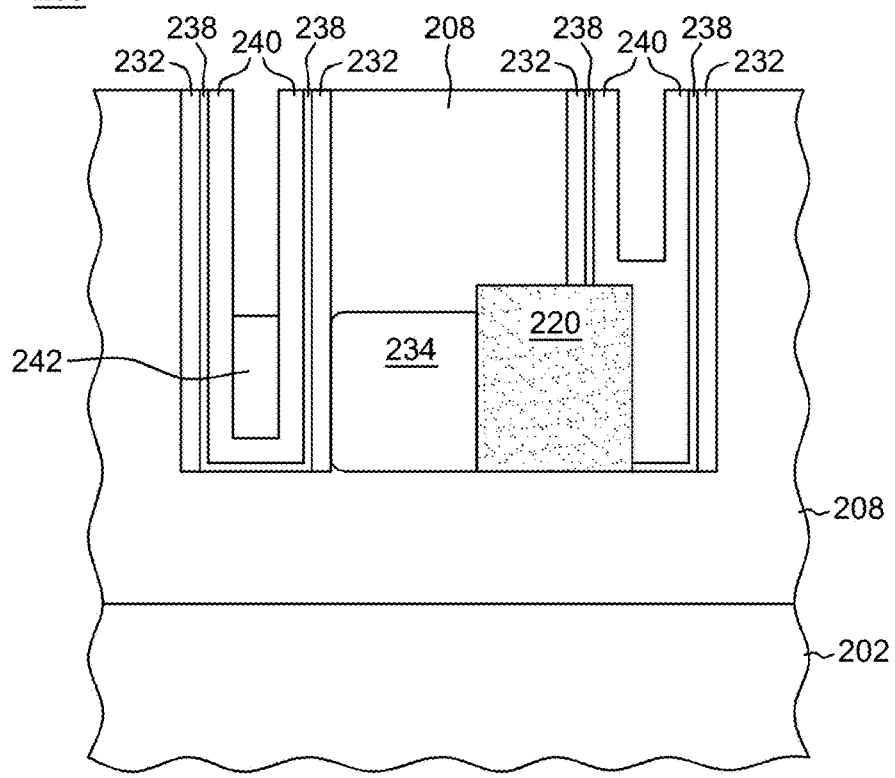
FIG. 19 depicts the cross-sectional elevational view of the intermediate semiconductor device of FIG. 17 after depositing an optical dispersive layer (ODL), in accordance with one or more aspects of the present invention.
Figure 20:
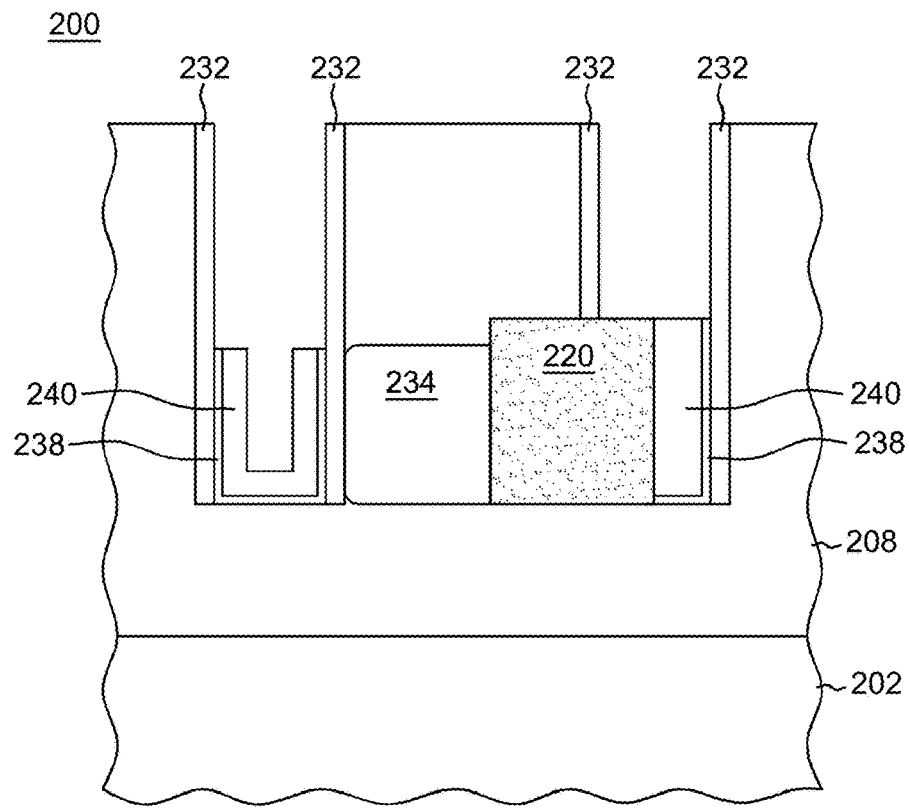
FIG. 20 depicts the cross-sectional elevation view of the intermediate semiconductor device of FIG. 19 after selectively etching to lower the work function metal and the high-k layers and removing the ODL layer, in accordance with one or more aspects of the present invention.
Figure 21:
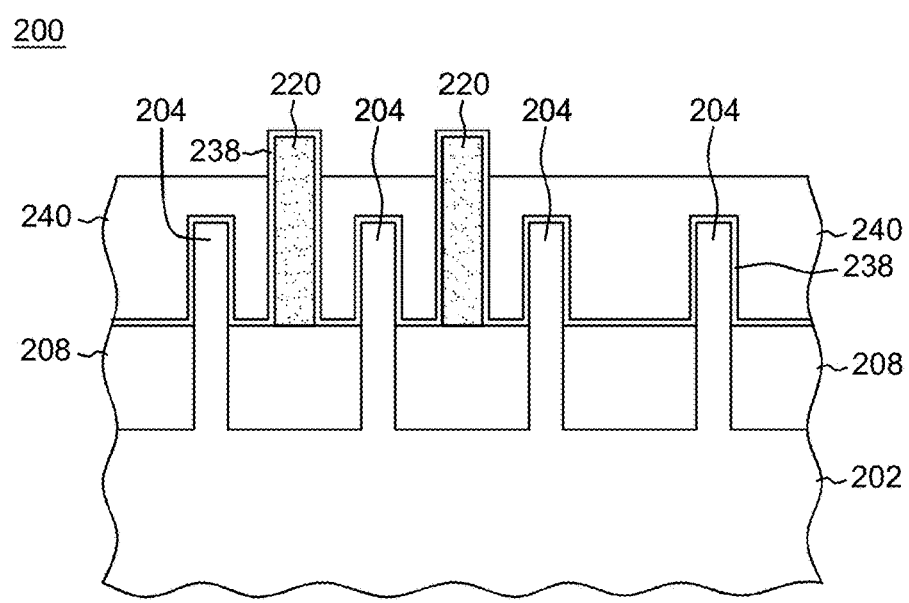
FIG. 21 depicts the cross-sectional elevational view of the intermediate semiconductor device of FIG. 18 after selectively etching to lower the work function metal and the high-k layers and removing the ODL layer, in accordance with one or more aspects of the present invention.

As shown in FIGS. 15 and 16, after the sacrificial gates 226 are formed, an epitaxial layer 234 may be formed on the wafer 200. The epitaxial layer 234 may form, for example, a source/drain region. Then, another oxide layer 208 may be deposited over the wafer 200 and another CMP performed. Next, a poly pull may be performed to remove the gate hard mask 230 and the sacrificial gate material 228 to form gate openings 236. A first part of the replacement metal gate (RMG) process may then be performed. The RMG process may include depositing a high-K layer 238, then a work function metal layer 240 in the gate openings 236, as shown in FIGS. 17 and 18. An optical dispersive layer (ODL) 242 may then be deposited over the wafer 200 and into at least a portion of the gate openings 236 inside of the work function metal layer 240, as shown in FIG. 19. A selective etch may then be performed to lower the work function metal layer 240 and the high-K layer 238, as shown in FIGS. 20 and 21. The ODL layer 242 may then be removed from the wafer 200, as shown in FIG. 20.

Figure 22:
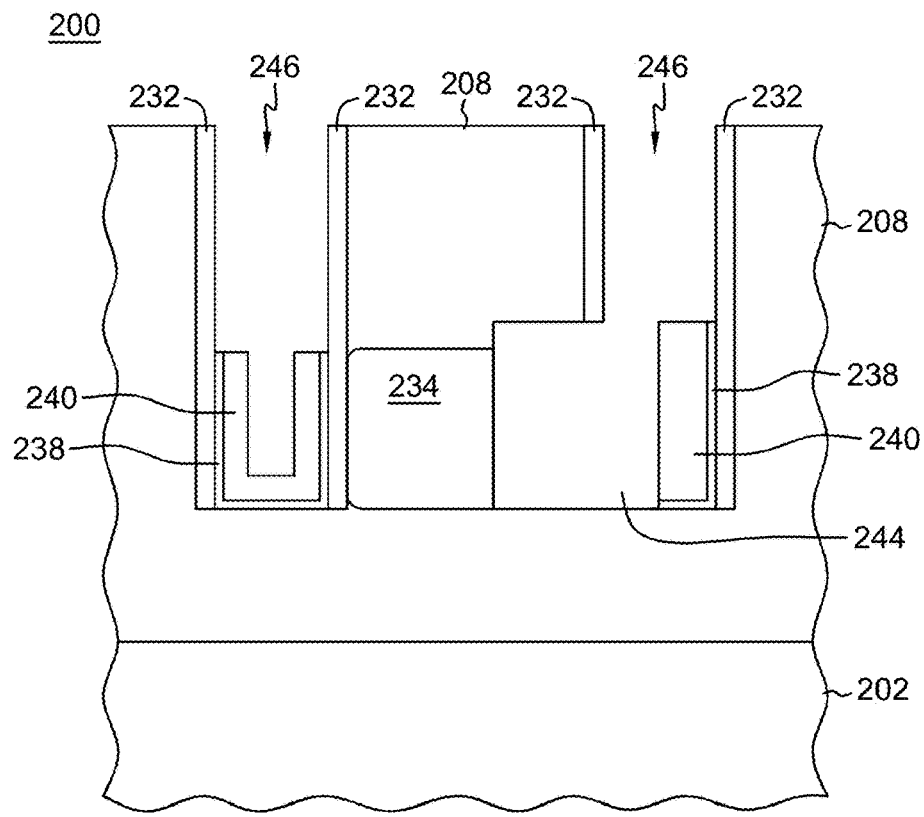
FIG. 22 depicts the cross-sectional elevational view of the intermediate semiconductor device of FIG. 20 after removing the sacrificial regions, in accordance with one or more aspects of the present invention.
Figure 23:
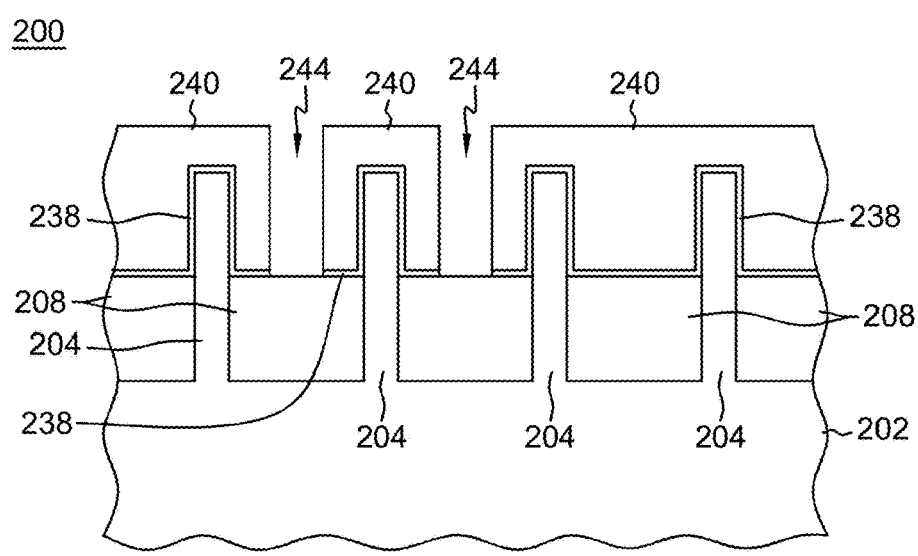
FIG. 23 depicts the cross-sectional elevational view of the intermediate semiconductor device of FIG. 21 after removing the sacrificial regions, in accordance with one or more aspects of the present invention.
Figure 24:
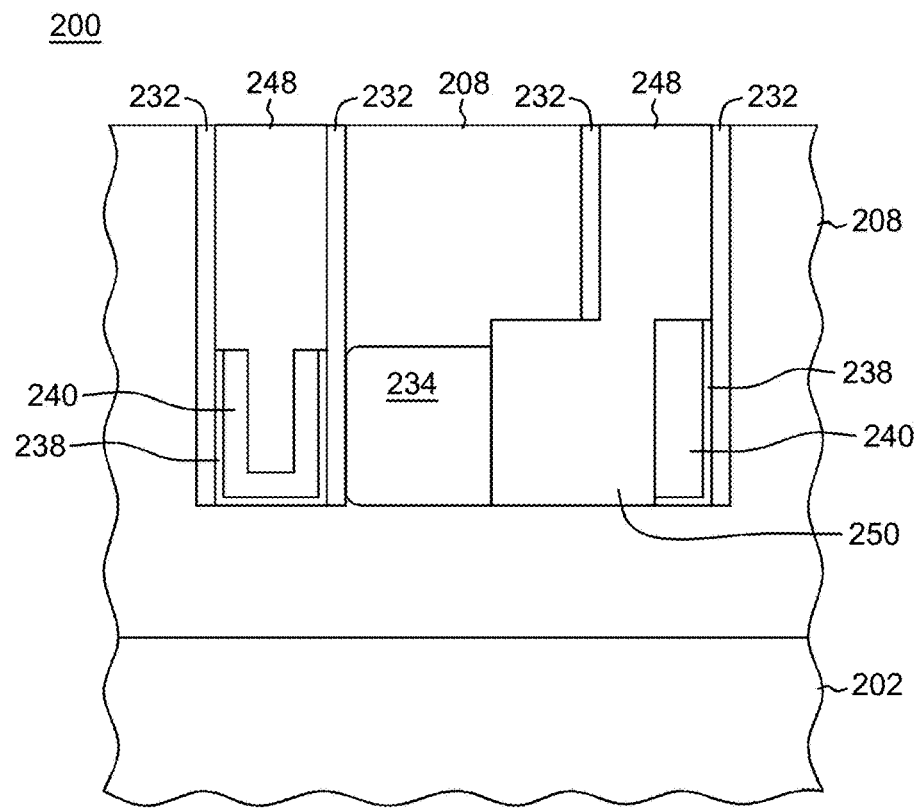
FIG. 24 depicts the cross-sectional elevational view of the intermediate semiconductor device of FIG. 22 after performing a metal fill, in accordance with one or more aspects of the present invention.
Figure 25:
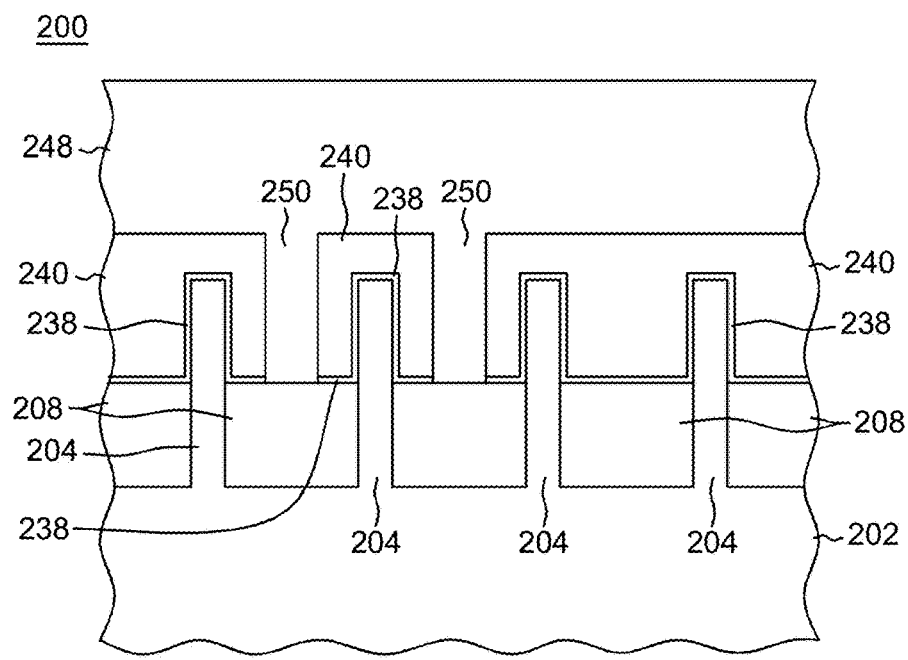
FIG. 25 depicts the cross-sectional elevational view of the intermediate semiconductor device of FIG. 23 after performing a metal fill, in accordance with one or more aspects of the present invention.
Figure 26:
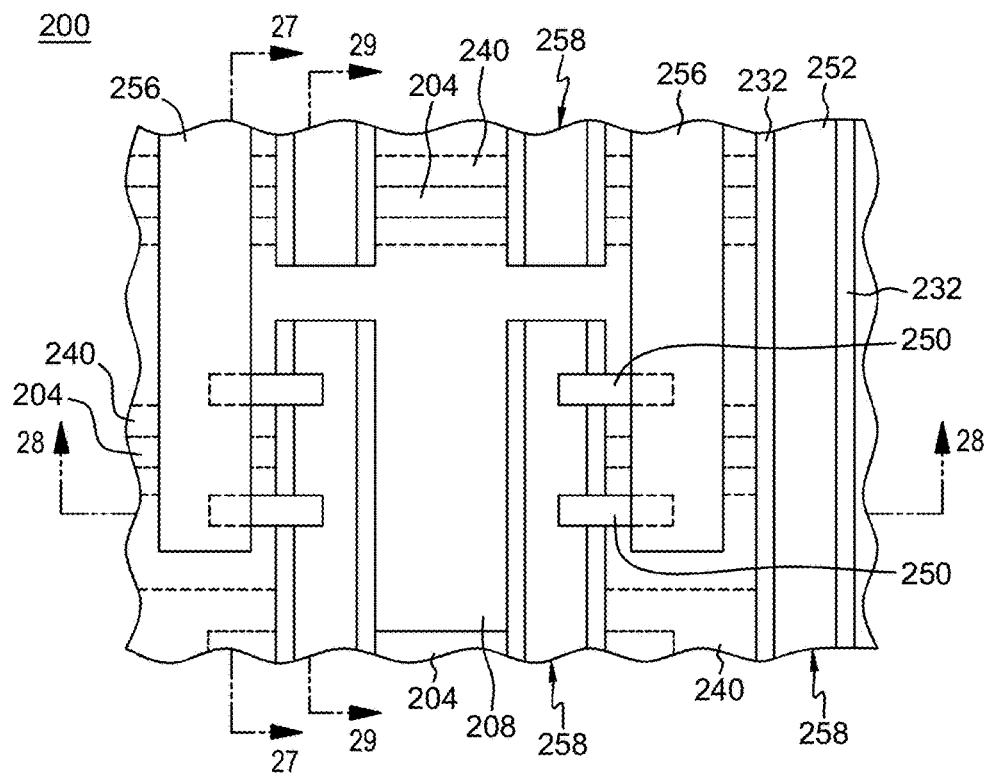
FIG. 26 depicts a top view of the intermediate semiconductor device of FIGS. 24 and 25 after depositing a self-aligned contact (SAC), polishing the device, depositing another oxide layer, polishing the device, and forming the source/drain contacts, in accordance with one or more aspects of the present invention.
Figure 28:
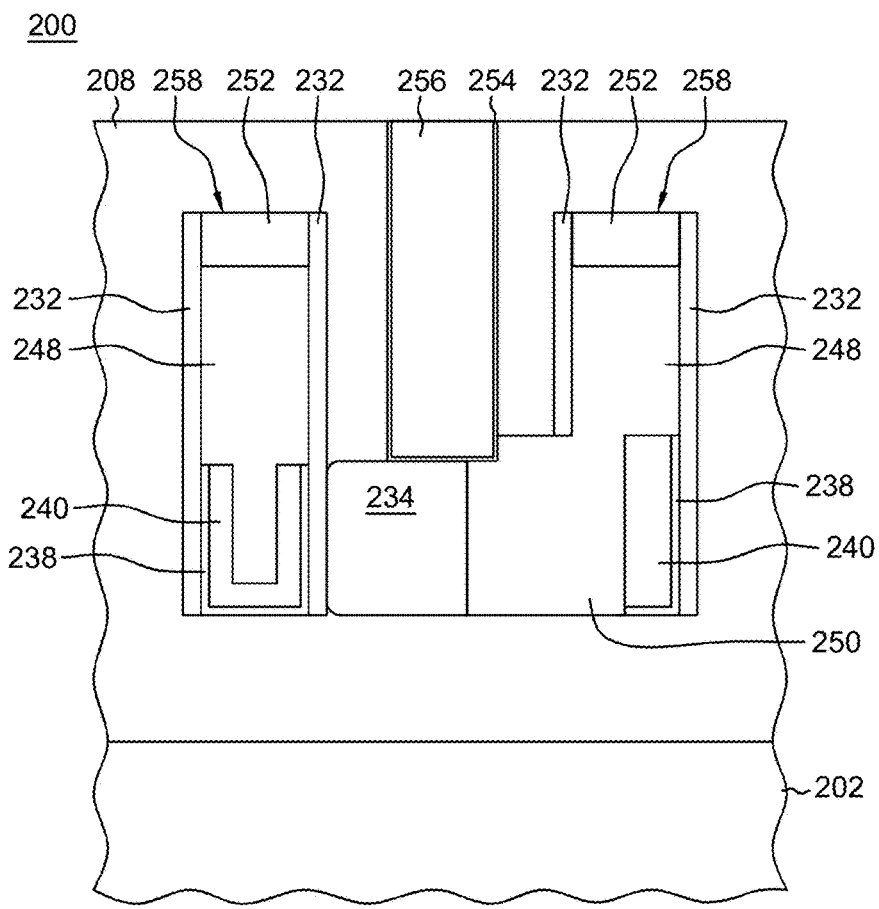
FIG. 28 depicts the cross-sectional elevational view of the intermediate semiconductor device of FIG. 26 taken along line 28-28, in accordance with one or more aspects of the present invention.
Figure 29:
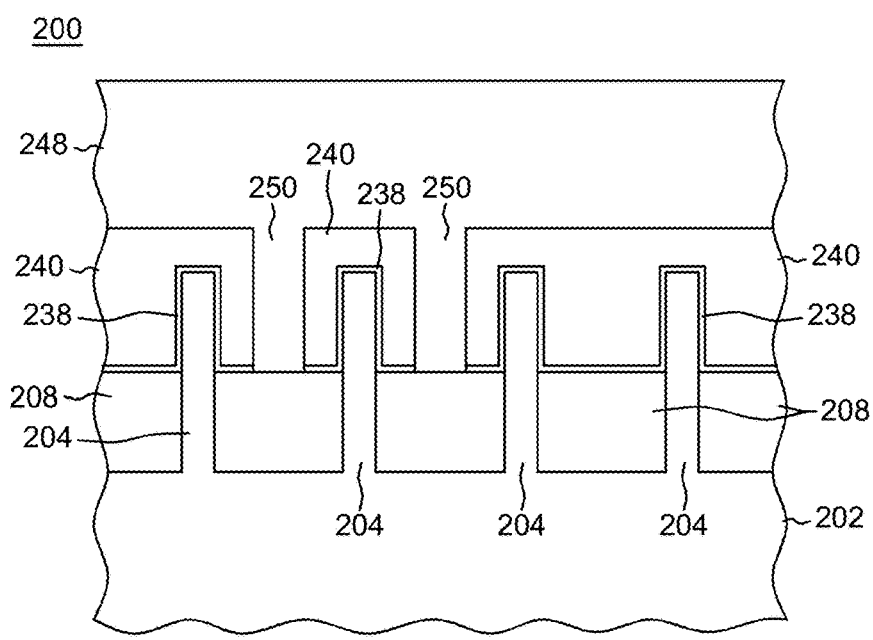
FIG. 29 depicts the cross-sectional elevational view of the intermediate semiconductor device of FIG. 26 taken along line 29-29, in accordance with one or more aspects of the present invention.

Next, the sacrificial pillar 220 may be removed with an etch to form at least one conductive path opening 244 and gate openings 246, as shown in FIGS. 22 and 23. The etch may be performed by, for example, a hot $H_3PO_4$ acid, $O_2$ ashing, or the like. The RMG process may then be completed by performing a metal fill process. The metal may be, for example, aluminum (Al), tungsten (W) or the like, and may be deposited by, for example, atomic layer deposition (ALD) or chemical vapor deposition (CVD). For example, a metal may be deposited into the conductive path openings 244 and gate openings 246 to form a gate metal region 248 and a conductive path metal region 250, as shown in FIGS. 24 and 25. The conductive path metal region 250 connects the gate metal 248 and the source/drain regions. After the metal 248, 250 is deposited a hard mask or self-aligned contact (SAC) cap 252 may be formed over the gate metal 248 within the gate spacers 232, as shown in FIGS. 26 and 28. A CMP may then be performed on the wafer 200 to complete formation of the gates 258, as shown in FIG. 28. Next, another oxide layer 208 may be deposited and a CMP performed, as shown in FIG. 28.

Figure 27:
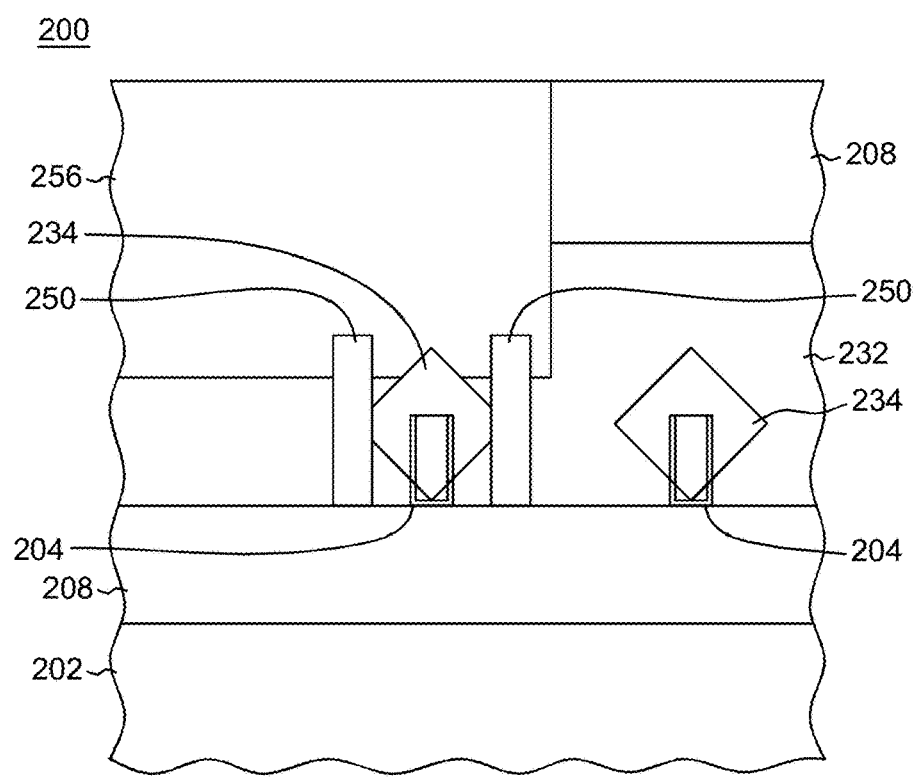
FIG. 27 depicts the cross-sectional elevational view of the intermediate semiconductor device of FIG. 26 taken along line 27-27, in accordance with one or more aspects of the present invention.

Finally, as shown in FIGS. 26-29, the source/drain contacts may be formed. First, lithography may be performed to form at least one contact opening (not shown) in the oxide layer 208. Next, the metal fill process may be performed by depositing a silicide layer 254 in the at least one contact opening. Then the contact metal 256 may be deposited to form the source/drain contacts, as shown in FIGS. 26-28. The source/drain contacts may be positioned over at least a portion of the source/drain regions 234 and overlap with at least a portion of the conductive path metal 250, as shown in FIG. 28.

Referring now to FIGS. 2, 3, 14, 15, 17, 19, 20, 22, 24, 26 and 30-43, another detailed embodiment of a portion of the semiconductor device formation process of FIG. 1 is depicted, by way of example only. FIGS. 2 and 3 show a portion of a semiconductor wafer 200 obtained during the fabrication process. As described in greater detail above, the wafer 200 may include, for example, a substrate 202, at least one fin 204 formed on the substrate 202, and a hard mask 206 positioned over the at least one fin 204. Finally, an oxide layer 208 may be deposited over the wafer 200.

Figure 30:
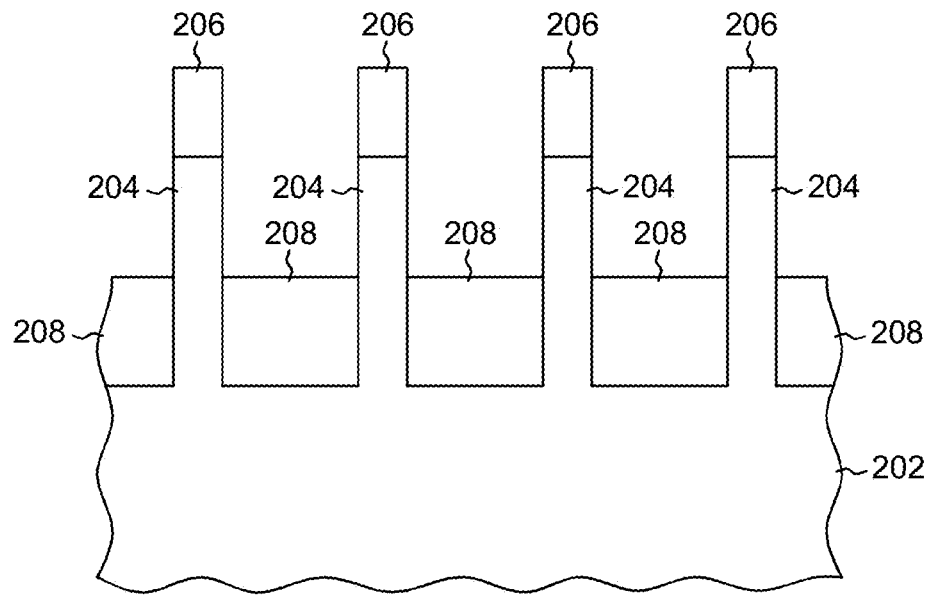
FIG. 30 depicts the cross-sectional elevation view of the intermediate semiconductor device of FIG. 3 after etching the oxide layer of the intermediate semiconductor device, in accordance with one or more aspects of the present invention.
Figure 31:
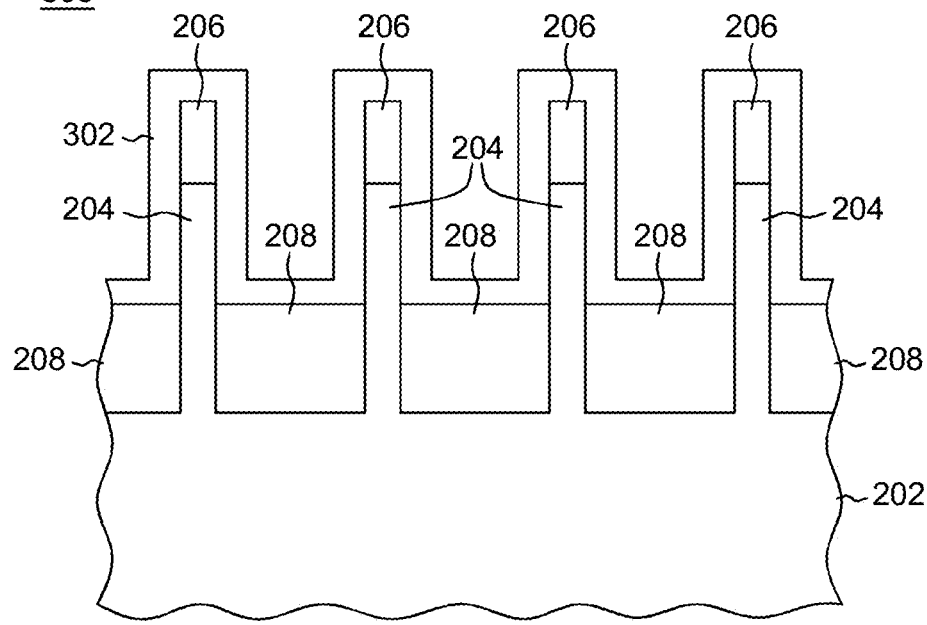
FIG. 31 depicts the cross-sectional elevational view of the intermediate semiconductor device of FIG. 30 after conformally depositing a spacer material, in accordance with one or more aspects of the present invention.
Figure 32:
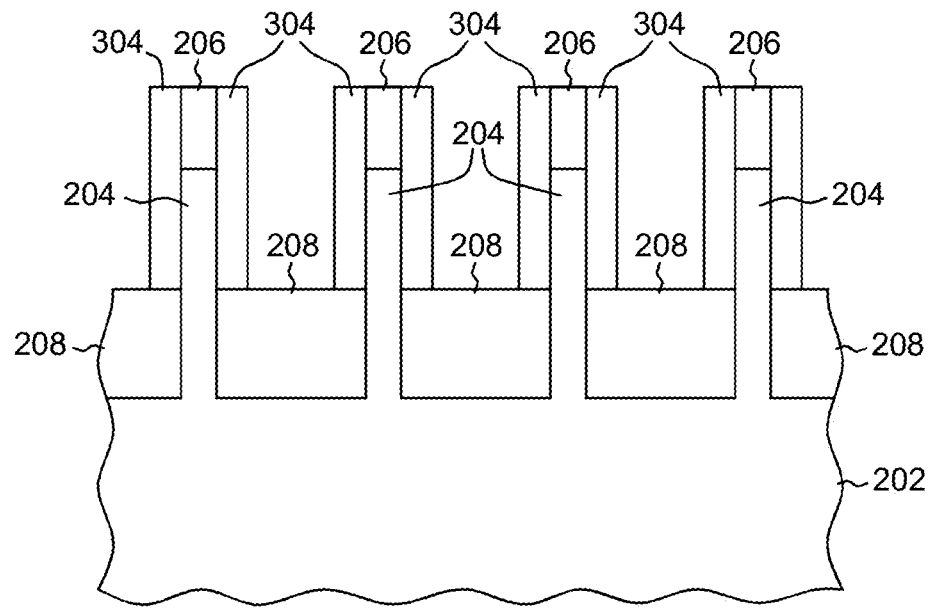
FIG. 32 depicts the cross-sectional elevational view of the intermediate semiconductor device of FIG. 31 after performing a vertical etch to remove the horizontal portions of the spacer material, in accordance with one or more aspects of the present invention.

Next, as shown in FIG. 30, an etch may be performed to the oxide layer 208 to reveal the hard masks 206 and a portion of the fins 204 forming intermediate semiconductor device 300. The etch forms recesses in the oxide layer 208 between the hard masks 206 and at least a portion of the fins 204. After etching is performed, spacers 304 may be formed adjacent to the hard masks 206 and the exposed portion of the fins 204, as shown in FIGS. 31 and 32. The spacers 304 may be formed by, for example, depositing a conformal spacer material layer 302 over the device 300. Then, a vertical etch may be performed to remove the horizontal spacer material 302 and form the sidewall spacers 304. The etch may be, for example, a reactive ion etch (RIE), such as, a controlled RIE. The RIE etch may be, for example, a nitride etch that is selective with respect to oxide. Then, another oxide layer 208 may be deposited over the wafer 300, as shown in FIG. 6.

Figure 33:
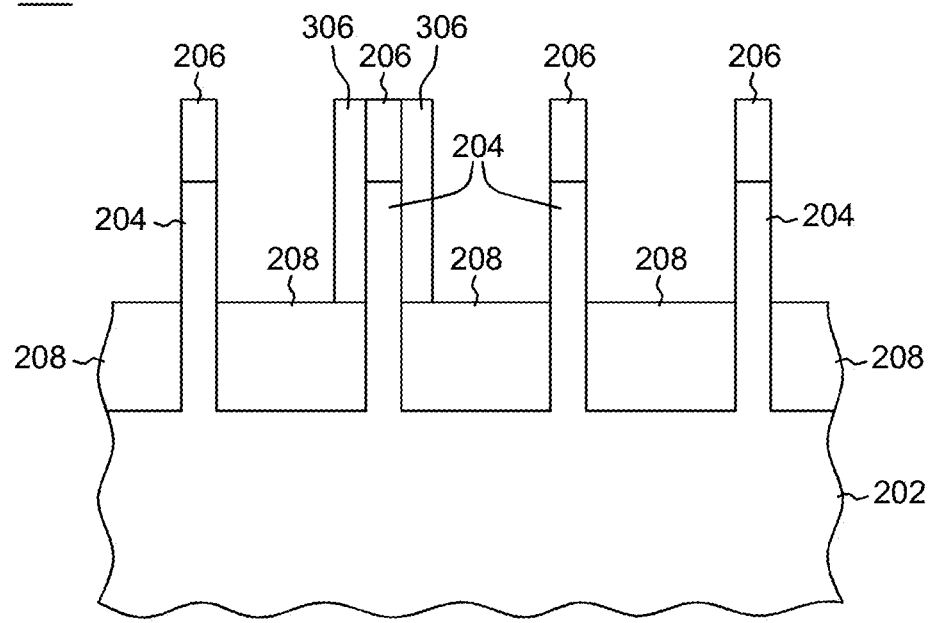
FIG. 33 depicts the cross-sectional elevational view of the intermediate semiconductor device of FIG. 32 after performing lithography and etching to remove the uncovered spacers, in accordance with one or more aspects of the present invention.
Figure 34:
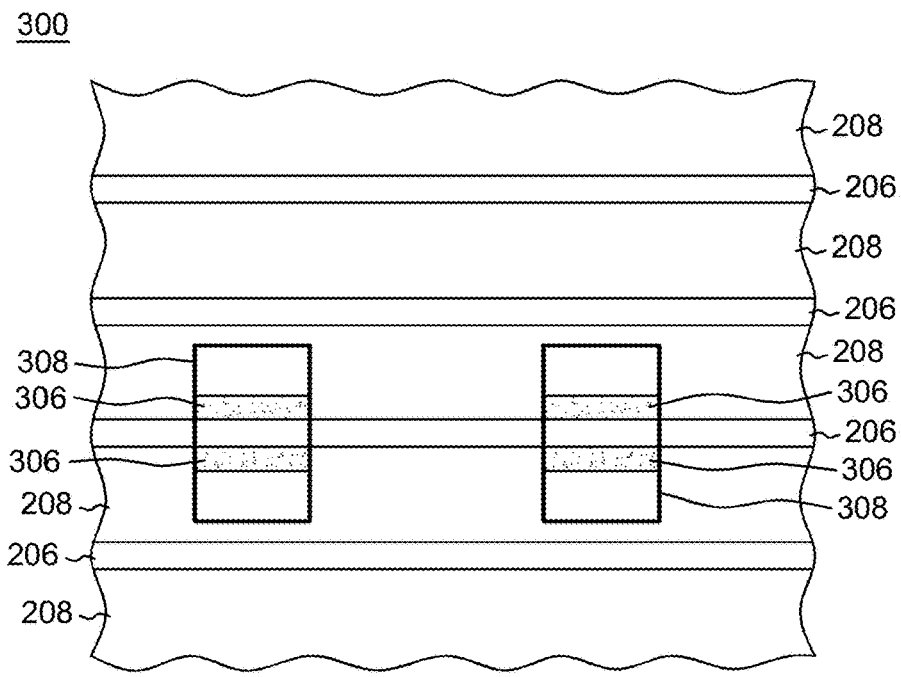
FIG. 34 depicts a top view of the intermediate semiconductor device of FIG. 33, in accordance with one or more aspects of the present invention.
Figure 35:
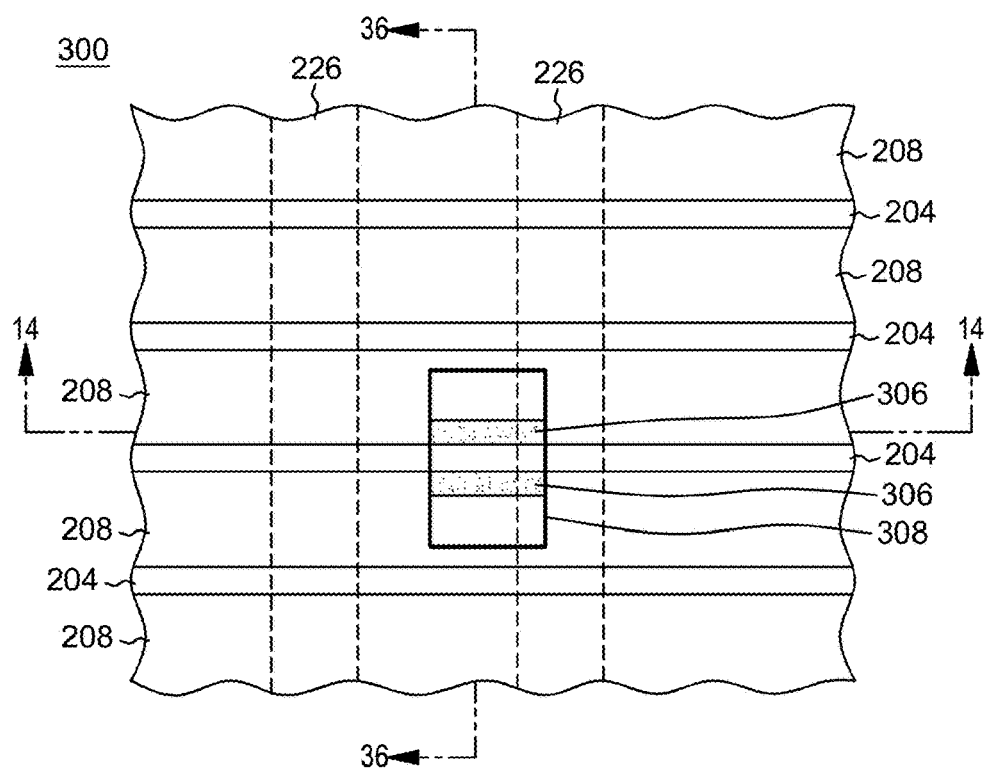
FIG. 35 depicts a top view of a portion of the intermediate semiconductor device of FIG. 34 after removing the hard masks and forming sacrificial gates, in accordance with one or more aspects of the present invention.

After the oxide layer 208 is polished, lithography may then be performed using a mask 308 to cover the conductive path openings into the device 300, as shown in FIG. 34. The lithography mask 308 may be designed to cover the spacers 304 which will form the conductive path openings, as shown in FIG. 34. Next, an etch may be performed to remove a portion of the oxide layer 208 surrounding the lithography mask 308 and the uncovered spacers 304, as shown in FIGS. 33 and 34. Then, the fin hard masks 206 may be removed, as shown in FIG. 35. The sacrificial gates 226 with spacers 232 may then be formed and include a sacrificial gate material 228 with a gate hard mask 230 positioned over the sacrificial gate material 228 and gate spacers 232 positioned adjacent to the sacrificial gate material 228 and the gate hard mask 230, as shown in FIG. 14.

Figure 36:
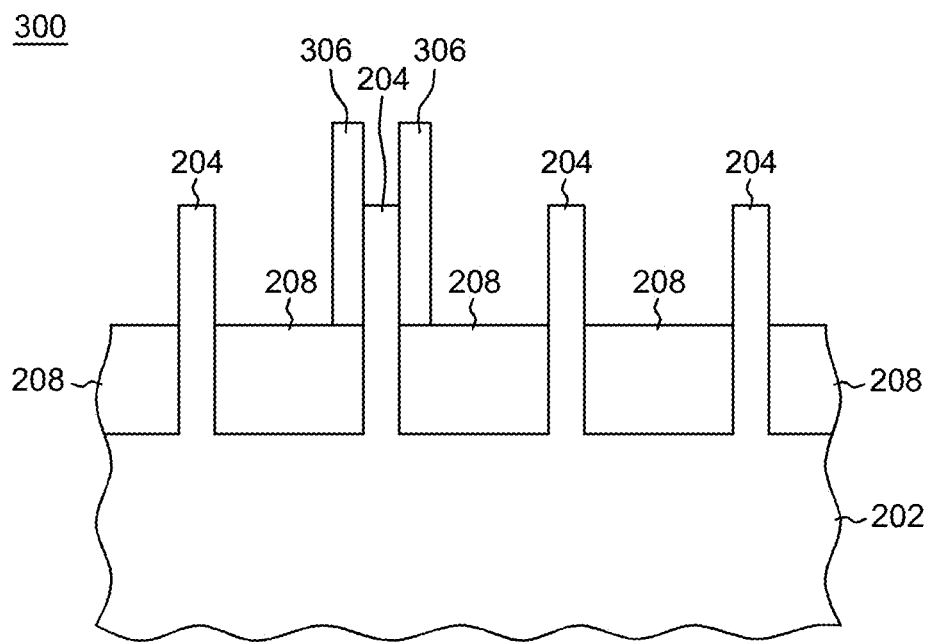
FIG. 36 depicts the cross-sectional elevational view of the intermediate semiconductor device of FIG. 35 taken along line 35-35 after growing an epitaxial layer, depositing another oxide layer, polishing the device, and performing a poly pull to remove the hard masks and sacrificial gate material, in accordance with one or more aspects of the present invention.
Figure 37:
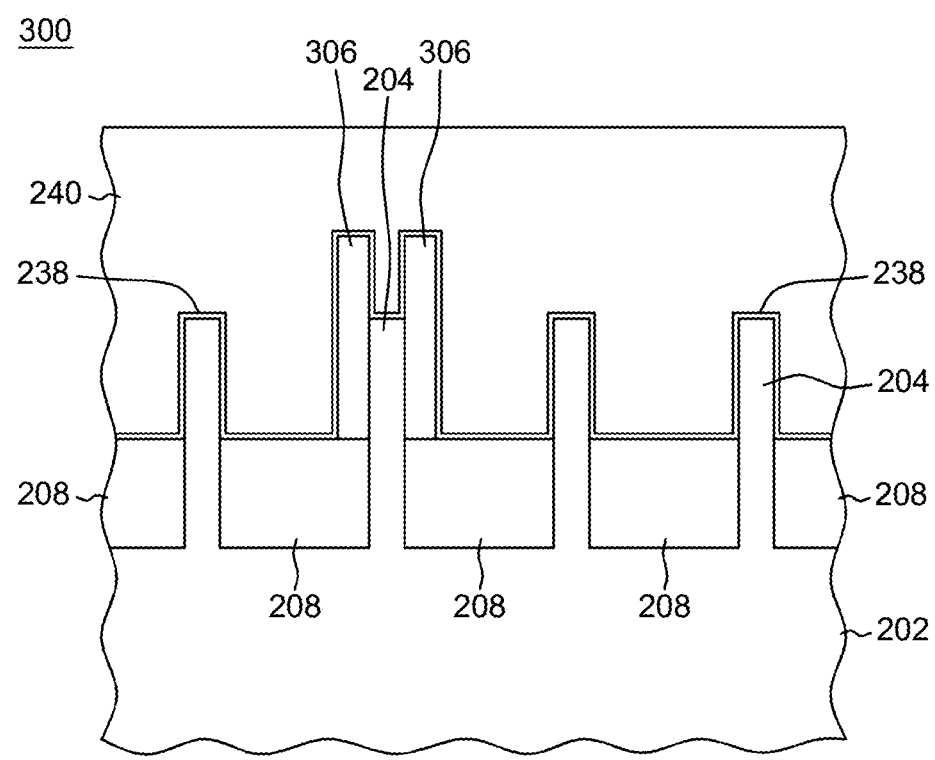
FIG. 37 depicts the cross-sectional elevational view of the intermediate semiconductor device of FIG. 36 after performing a first part of the RMG processing, in accordance with one or more aspects of the present invention.
Figure 38:
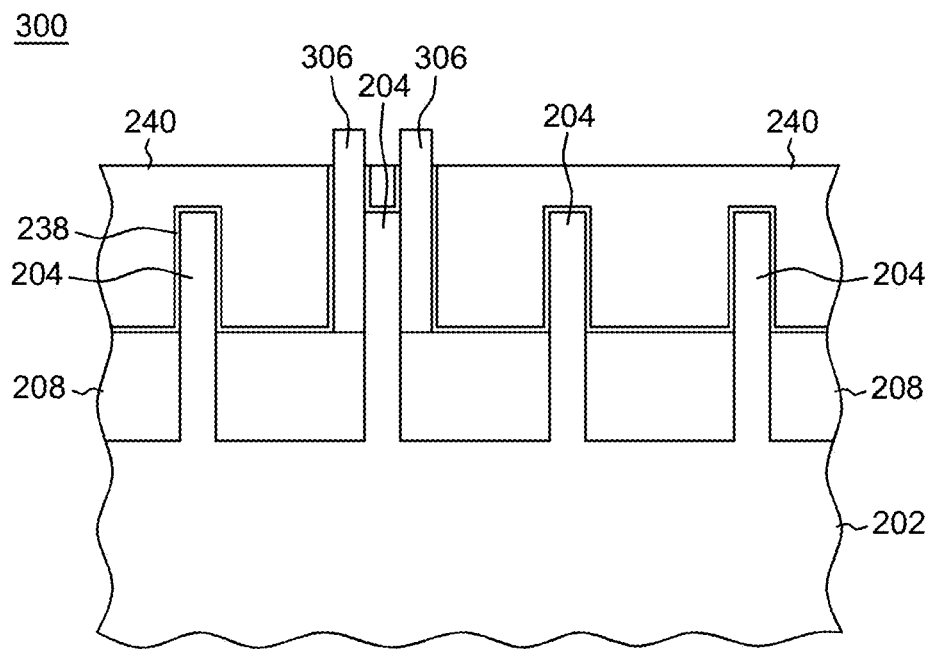
FIG. 38 depicts the cross-sectional elevational view of the intermediate semiconductor device of FIG. 37 after selectively etching to lower the work function and high-k layers and to remove the ODL layer, in accordance with one or more aspects of the present invention.

As shown in FIG. 15 and with reference to FIG. 36, after the sacrificial gates 226 are formed, an epitaxial layer 234 may be grown on the device 300. The epitaxial layer 234 may be grown, for example, such that it connects the fin 204 to the conductive path 310 and the replacement gate 248. Then, another oxide layer 208 may be deposited over the device 300 and a CMP performed. Next, a poly pull may be performed to remove the gate hard mask 230 and the sacrificial gate material 228 to form gate openings 236, as shown in FIG. 15. A first part of the replacement metal gate (RMG) process may then be performed. The first part of the RMG process may include depositing a high-K layer 238 and a work function metal layer 240 in the gate openings 236, as shown in FIGS. 17 and 37. An optical dispersive layer (ODL) 242 may then be deposited over the wafer 200 and into a portion of the gate openings 236 inside of the work function metal layer 240, as shown in FIG. 19. A selective etch may then be performed to lower the work function metal layer 240 and the high-K layer 238, as shown in FIGS. 20 and 38. The ODL layer 242 may then be removed from the device 300, as shown in FIG. 20.

Figure 39:
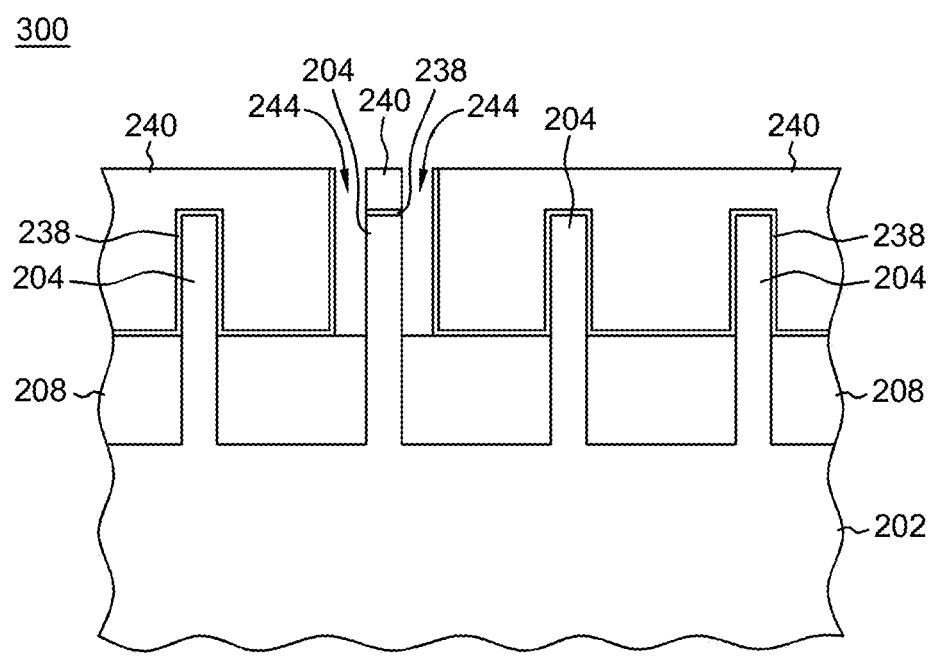
FIG. 39 depicts the cross-sectional elevational view of the intermediate semiconductor device of FIG. 38 after removing the sacrificial regions, in accordance with one or more aspects of the present invention.
Figure 40:
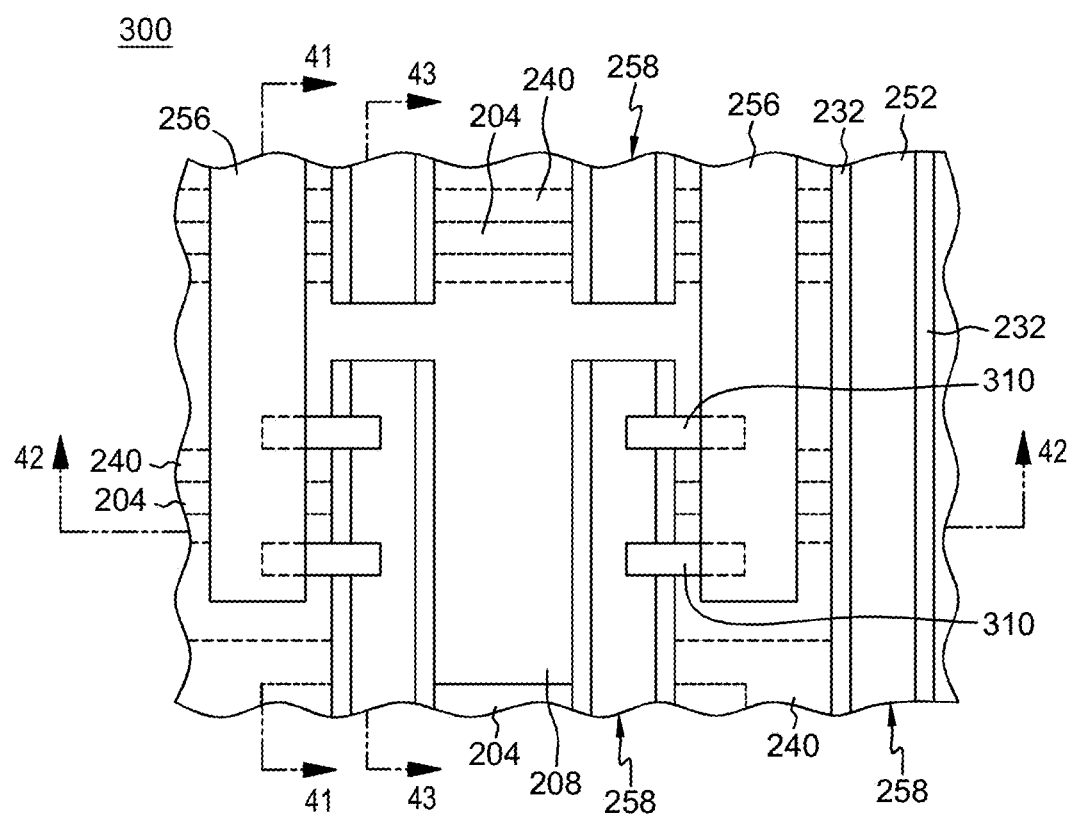
FIG. 40 depicts a top view of the intermediate semiconductor device of FIG. 39 after performing a metal fill and polishing, depositing a self-aligned contact (SAC), polishing the device, depositing another oxide layer, polishing the device, and forming the source/drain contacts, in accordance with one or more aspects of the present invention.
Figure 41:
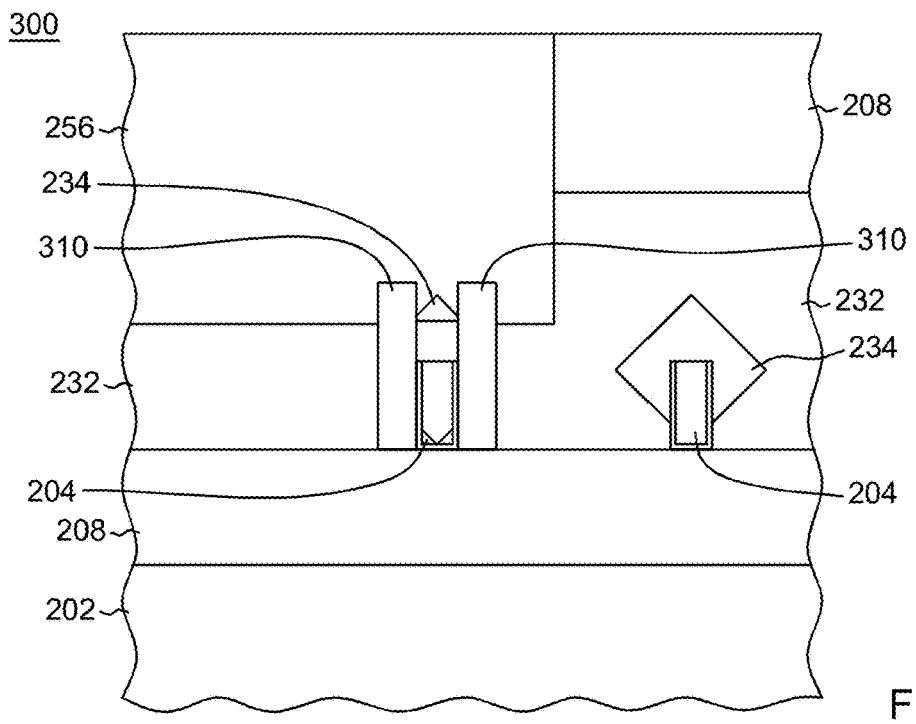
FIG. 41 depicts the cross-sectional elevational view of the intermediate semiconductor device of FIG. 40 taken along line 41-41, in accordance with one or more aspects of the present invention.
Figure 42:
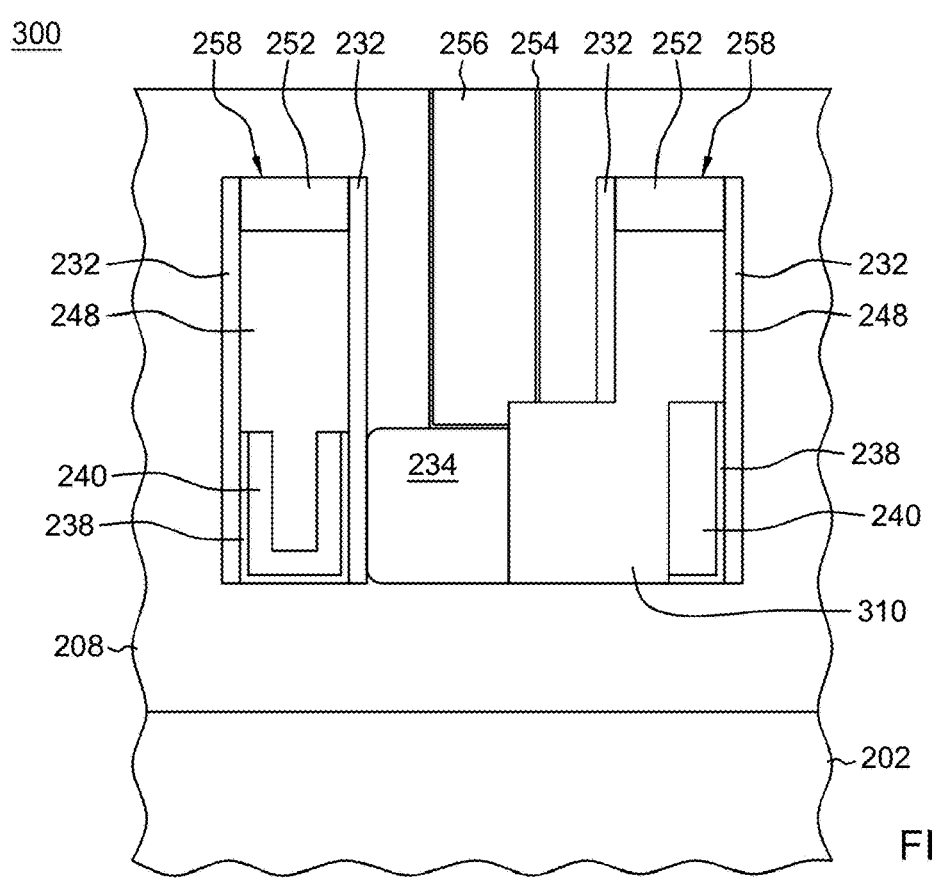
FIG. 42 depicts the cross-sectional elevational view of the intermediate semiconductor device of FIG. 40 taken along line 42-42, in accordance with one or more aspects of the present invention.
Figure 43:
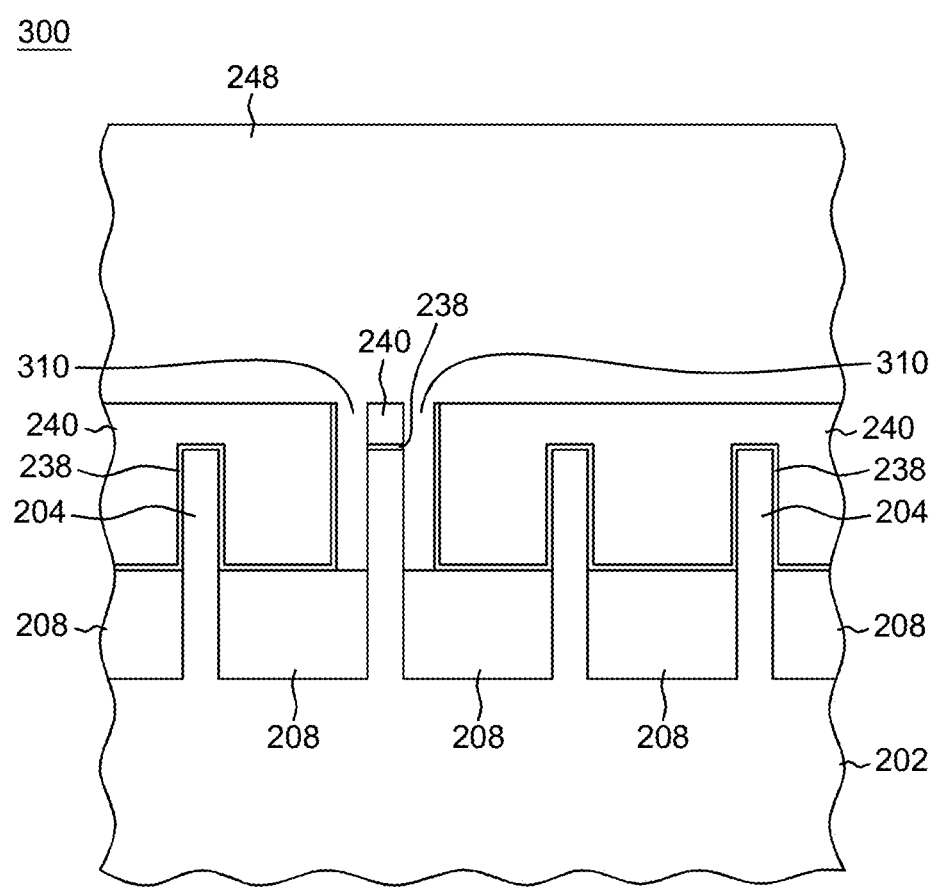
FIG. 43 depicts the cross-sectional elevational view of the intermediate semiconductor device of FIG. 40 taken along line 43-43, in accordance with one or more aspects of the present invention.

Next, the sacrificial pillar 306 may be removed with an etch to form at least one conductive path opening 244 and gate openings 246, as shown in FIGS. 22 and 39. The etch may be performed by, for example, a hot $H_3PO_4$ acid, $O_2$ ashing, or the like. The RMG process may then be completed by performing a metal fill process. The metal may be, for example, aluminum (Al), tungsten (W) or the like, and may be deposited by, for example, atomic layer deposition (ALD) or chemical vapor deposition (CVD). For example, a metal may be deposited into the conductive path openings 244 and gate openings 246 to form a gate metal region 248 and a conductive path metal region 310, as shown in FIGS. 24 and 43. The conductive path metal region 250 connects the gate metal 248 and the source/drain regions. After the metal 248, 250 is deposited a hard mask or self-aligned contact (SAC) cap 252 may be formed over the gate metal 248 within the gate spacers 232, as shown in FIGS. 26 and 28. A CMP may then be performed on the device 300 to complete formation of the gates 258, as shown in FIGS. 40 and 42. Next, another oxide layer 208 may be deposited and a CMP performed, as shown in FIG. 42.

Finally, as shown in FIGS. 40-43, the source/drain contacts may be formed. First, lithography may be performed to form at least one contact opening (not shown) in the oxide layer 208. Next, the metal fill process may be performed by depositing a silicide layer 254 in the at least one contact opening. Then the contact metal 256 may be deposited to form the source/drain contacts, as shown in FIGS. 40-43. The source/drain contacts may be positioned over at least a portion of the source/drain regions 234 and overlap with at least a portion of the conductive path metal 310, as shown in FIG. 42.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A semiconductor device comprising:
   a substrate;
   a first fin and a second fin on the substrate;
   a conductive path region positioned between the first fin and the second fin, the conductive path region having a bottom surface;
   a source/drain region positioned adjacent to the conductive path region, the source/drain region having a bottom surface; and
   a gate including a work function metal layer and a high-k dielectric layer, the gate having a bottom surface,
   wherein the conductive path region is arranged laterally between the source/drain region and the gate, the bottom surface of the conductive path region is positioned adjacent to the bottom surface of the gate and adjacent to the bottom surface of the source/drain region, the work function metal layer is in direct contact with the conductive path region, and the source/drain region is in direct contact with the conductive path region, and the bottom surface of the conductive path region, the bottom surface of the gate, and the bottom surface of the source/drain region are horizontally coplanar.

2. The semiconductor device of claim 1, further comprising:
   a source/drain contact positioned over at least a portion of the source/drain region and overlapping with at least a portion of the conductive path region.

3. The semiconductor device of claim 1, wherein the work function metal layer is arranged on one side of the conductive path region.

4. The semiconductor device of claim 1, wherein the conductive path region includes a portion positioned below a portion of the gate.

5. The semiconductor device of claim 1, further comprising:
   an oxide layer,
   wherein the bottom surface of the conductive path region, the bottom surface of the gate and the bottom surface of the source/drain region are positioned over the oxide layer.

6. The semiconductor device of claim 5, wherein the oxide layer provides a reference plane for the bottom surface of the conductive path region, the bottom surface of the gate and the bottom surface of the source/drain region.

7. The semiconductor device of claim 1, further comprising:
   an oxide layer,
   wherein the bottom surface of the conductive path region, the bottom surface of the gate and the bottom surface of the source/drain region are laterally arranged over the oxide layer.

8. The semiconductor device of claim 7, wherein the oxide layer provides a reference plane for the bottom surface of the conductive path region, the bottom surface of the gate and the bottom surface of the source/drain region.

* * * * *